United States Patent
Livesay et al.

(10) Patent No.: US 7,546,016 B2
(45) Date of Patent: Jun. 9, 2009

(54) OPTICAL ELEMENTS FORMED BY INDUCING CHANGES IN THE INDEX OF REFRACTION BY UTILIZING ELECTRON BEAM RADIATION

(75) Inventors: William R. Livesay, San Diego, CA (US); Scott M. Zimmerman, Baskin Ridge, NJ (US)

(73) Assignee: e-Beam & Light, Inc., San Diego, CA (US)

( * ) Notice: Subject to any disclaimer, the term of this patent is extended or adjusted under 35 U.S.C. 154(b) by 246 days.

(21) Appl. No.: 11/231,242

(22) Filed: Sep. 20, 2005

(65) Prior Publication Data

US 2006/0104584 A1  May 18, 2006

Related U.S. Application Data

(63) Continuation-in-part of application No. 10/183,784, filed on Jun. 27, 2002, now Pat. No. 7,026,634.

(60) Provisional application No. 60/302,152, filed on Jun. 28, 2001.

(51) Int. Cl.
*G02B 6/10* (2006.01)

(52) U.S. Cl. .................. 385/129; 385/130; 385/131; 385/132

(58) Field of Classification Search .......... 385/129–132
See application file for complete search history.

(56) References Cited

U.S. PATENT DOCUMENTS

| | | | |
|---|---|---|---|
| 5,003,178 A | | 3/1991 | Livesay |
| 5,136,677 A | * | 8/1992 | Drexhage et al. ............ 385/123 |
| 5,271,082 A | * | 12/1993 | Braglia et al. ................ 385/129 |
| 5,432,881 A | * | 7/1995 | Doi ............................ 385/132 |
| 5,572,619 A | | 11/1996 | Maruo et al. |
| 5,598,501 A | * | 1/1997 | Maruo et al. ................. 385/143 |
| 6,132,814 A | | 10/2000 | Livesay et al. |
| 6,607,991 B1 | | 8/2003 | Livesay et al. |
| 6,796,148 B1 | * | 9/2004 | Borrelli et al. ................ 65/386 |

* cited by examiner

*Primary Examiner*—Hemang Sanghavi
(74) *Attorney, Agent, or Firm*—William Propp, Esq.

(57) ABSTRACT

An optical element such as an interference filter will have adjacent layers of different indexes of refraction but formed of the same optical material. An optical element such as a diffraction grating or beam-splitter will have adjacent sections of different indexes of refraction in the same optical material layer. An optical element such as a waveguide will have a core layer of a higher index of refraction partially or completely surrounded by a cladding layer of a lower index of refraction formed of the same optical material.

5 Claims, 25 Drawing Sheets

— OR —

— OR —

— OR —

— OR —

OPTICAL ELEMENTS FORMED BY INDUCING CHANGES IN THE INDEX OF REFRACTION BY UTILIZING ELECTRON BEAM RADIATION

This application is a continuation-in-part of U.S. patent application Ser. No. 10/183,784 titled "Method And Apparatus For Forming Optical Materials And Devices" filed on Jun. 27, 2002, now U.S. Pat. No. 7,026,634 which claims the benefit of U.S. Provisional Application No. 60/302,152 titled "Novel Optical Materials Formed Using Electron Beam Irradiation And Methods For Forming Optical Devices" filed on Jun. 28, 2001.

This application is related to co-pending U.S. patent application Ser. Nos. 11/231,242, 11/230,682, filed on the same date as the present application, with the same inventors and commonly assigned to the same assignee as the present invention and herein incorporated by reference.

BACKGROUND OF THE INVENTION

The present invention relates generally to the optical elements having at least two optical material layers having different refractive indexes and more specifically to optical elements having at least two layers of the same optical material but with different refractive indexes and a method for fabricating optical elements by inducing changes in the index of refraction in optical materials utilizing large area electron beam radiation.

Various optical elements have a multiple layer structure of layers of different optical materials having different indexes of refraction or a multiple layer coating of layers of different optical materials having different indexes of refraction. These multiple layer optical elements have a variety of uses in total internal reflection, wavelength filters and diffraction.

An optical waveguide carries a light beam along a designated path within the waveguide. The optical waveguide is typically formed by utilizing materials of different refractive index. The inner waveguide is formed of a first optical material having a high index of refraction. The outer cladding layer around the inner waveguide is formed of a second different optical material having a second low index of refraction.

The inner waveguide material typically exhibits high optical transmission for a light beam to maximize the internal reflection of a light beam traveling along the inner layer of the waveguide and to minimize the signal loss of the light beam. The current state of the art of producing these waveguides and producing these materials of different index of refraction is to utilize two different materials, which are layered in an additive or subtractive process.

Similarly, the inner cylindrical core layer of an optical fiber will have a high index of refraction while the surrounding cylindrical cladding layer will have a low index of refraction to maximize the internal reflection of a light beam traveling along the inner core of the optical fiber.

An interference filter is formed by a first layer of high refractive index material on a substrate with a second layer of a low refractive index material on the first layer. The interference filter can be an antireflection coating to reduce reflected light by decreasing the refractive index difference between the substrate next to the first layer and the ambient atmosphere next to the second layer. The interference filter can be a heat reflective thermal control film, which transmits visible radiation while reflecting infrared radiation. The interference filter can also be used to reflect or transmit selected wavelengths of light or reflect or transmit ranges of wavelengths of light.

Alternating layers of high and low refractive index materials can be used as diffraction gratings or beamsplitters.

The index of refraction can vary within a layer or across multiple layers to form gradient index optical elements. Optical waveguides and optical fibers can have gradient indexes. A gradient index lens functions by diffraction from the layers of different refractive indexes, rather than the traditional refraction from the curved surface of a lens made from a single material having a single index of refraction.

The two different materials with different indexes of refraction are structurally and/or chemically distinct and are brought together during the assembly process for the optical element.

Typically, these optical elements are fabricated by chemical vapor deposition of the layers of different optical materials. However this limits the possible optical material layers since the layers must be compatible with fabrication by deposition and affinity for bonding with each other. Similarly, the optical materials may require different exposure times, temperatures, pressures and atmospheres which may alter the other optical material.

In waveguides and optical fibers in particular, an optical adhesive may be mandated to bond the layers of structurally and chemically distinct materials together. The adhesive layer will effect waveguiding in waveguides and optical fibers and also effect transmittance and reflectance if used in other optical elements.

The multiple layers of different materials create problems in fabrication as edge breakage and differential polishing rates between the glue and core/cladding materials must be taken into account as well as controlling appropriate glue thickness.

Separate from the fabrication issue is that the dissimilar optical materials may have different coefficients of thermal expansion which will cause the fabricated optical element to function differently or not at all at different temperatures.

It is an object of the present invention to provide different refractive indexes from the same optical material within an optical element.

SUMMARY OF THE INVENTION

According to the present invention, the exposure of selected optical materials to large area electron beam irradiation can raise the refractive index of the optical material to allow the fabrication of waveguides, optical fibers, gradient index lenses, interference filters, antireflection coatings, heat reflective thermal control coatings and other optical elements.

The selected starting optical material is deposited on a substrate. The optical material is then exposed with the electron beam at an energy and dose, while the substrate is heated to the appropriate temperature, to raise the refractive index of the selected optical material on the substrate. The optical material and substrate are preferably loaded into a vacuum chamber with a flood electron source to expose the top side of the substrate and a heating element to apply heat to the backside of the substrate. The method utilizes a large area electron beam exposure system in a soft vacuum environment. By adjusting the process conditions, such as electron beam total dose and energy, temperature of the selected optical material, and ambient atmosphere, the refractive index of the optical material can be altered to become either a gradient index of refraction or a uniform index of refraction.

The electron beam can partially penetrate the single optical material layer. A single optical material layer can have a first index of refraction. Only the upper portion, or sub-layer, of the single layer is exposed to large beam electron beam radiation. After irradiation, the upper portion of the single layer has a higher index of refraction than the lower portion of the layer, also a sub-layer, which still has the first original index of refraction. The two sub-layers are integral and adjacent to each other. These alternating sub-layers of high and low indexes of refraction can be used as interference filters, an anti-reflection coating for an optical element, a heat reflective thermal control layer for an optical element or a wavelength sensitive reflectance/transmittance interference filter for an optical element. Multiple alternating sub-layers of high and low indexes of refraction can be used as diffraction gratings or beam-splitters.

The use of an aperture mask or an embossing structure controls and limits the electron beam exposure to certain specified areas or sections of the optical material layer. The optical material layer can have a first index of refraction. Only the portion of the optical material layer exposed through the aperture or embossed structure is exposed to the large beam electron beam radiation. After irradiation, the exposed areas or sections of the optical material layer have a higher index of refraction than the remaining unexposed portion of the optical material layer, which still has the first original index of refraction.

High index of refraction areas of the optical material on the low index of refraction optical material layer can form a microlens array, a diffraction grating or a beam-splitter. The high refraction areas of the optical material can form the core layer of a waveguide with the partially or completely surrounding low index of refraction optical material layer forming the cladding layer of the waveguide.

Alternating sections of optical material of high and low indexes of refraction can be used as diffraction gratings or beam-splitters. Layers of optical material of high index of refraction within the optical material layer of low index of refraction can form a binary diffractive optical element.

The electron beam apparatus and method can form an optical fiber for use as a waveguide having a core of a high refractive index surrounded by a cladding layer of a low refractive index formed of the same optical material.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures so not depart from the spirit and scope of the invention is its broadest form.

BRIEF DESCRIPTION OF THE DRAWINGS

Other aspects, features, and advantages of the present invention will become more filly apparent from the following detailed description, the appended claim, and the accompanying drawings in which:

DETAILED DESCRIPTION OF THE INVENTION

Figure 1:
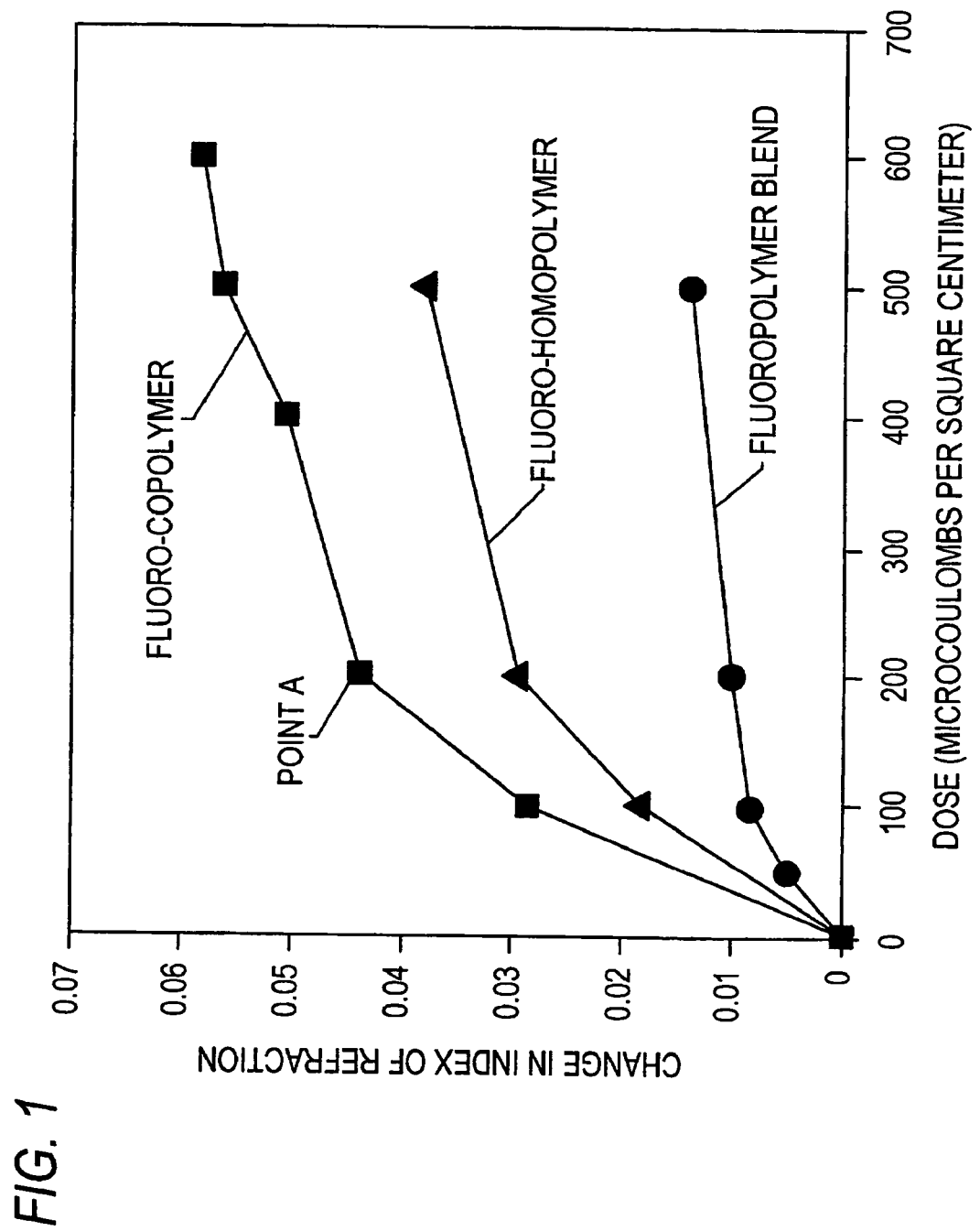
FIG. 1 shows a graph depicting the change in surface refractive index as a function of electron beam dosage while maintaining current and energy constant.
Figure 2:
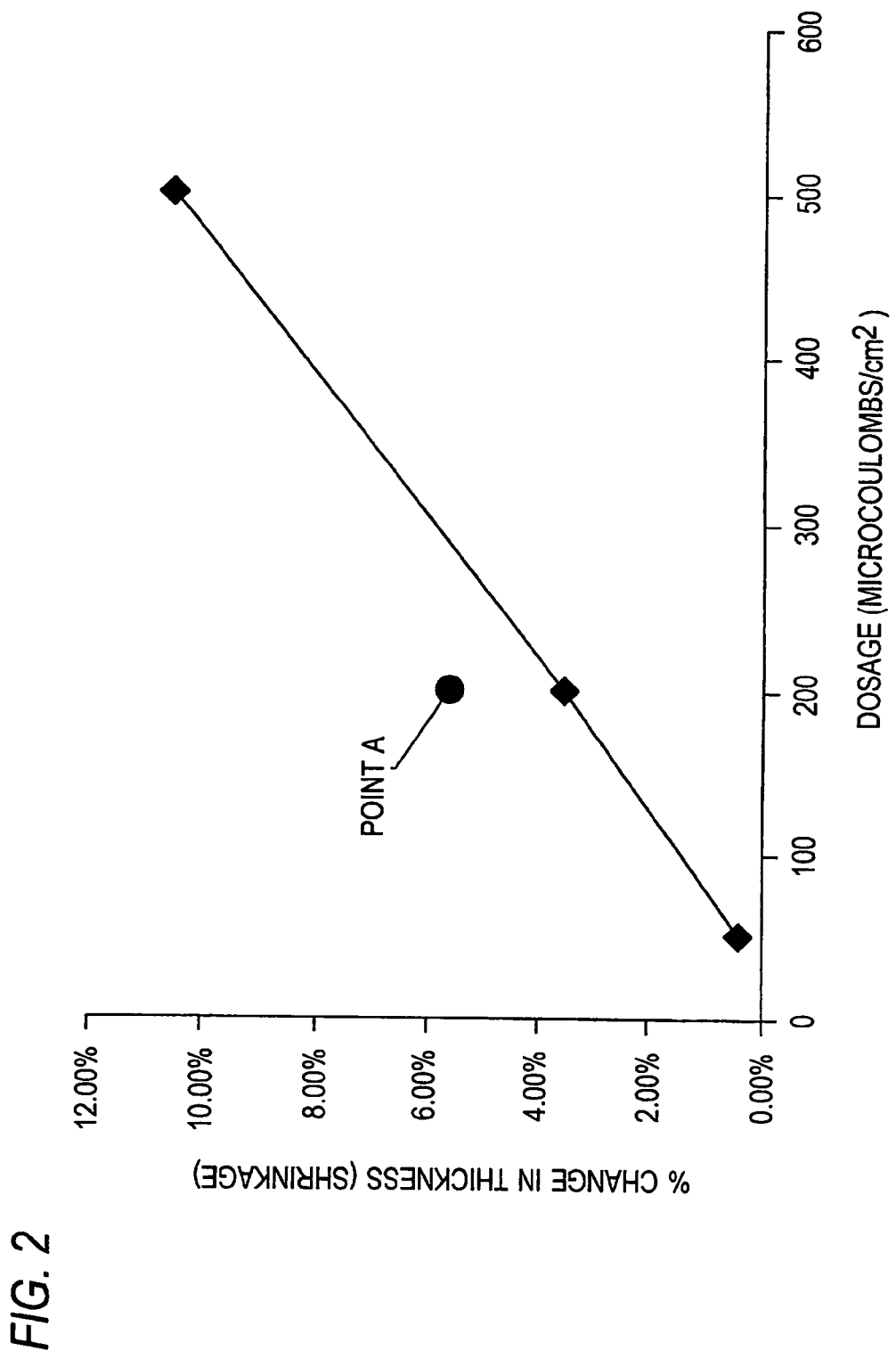
FIG. 2 shows a graph depicting the change in sample thickness as a function of electron beam dosage while maintaining current and energy constant.
Figure 3A:
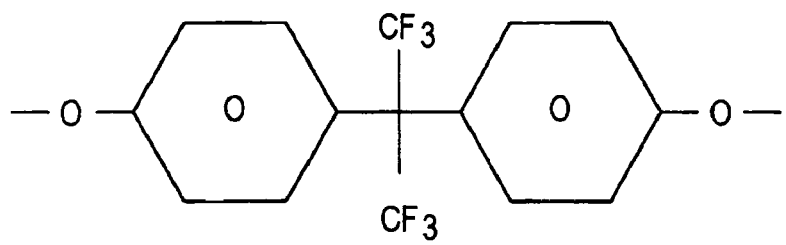
FIG. 3 schematically depicts in FIGS. 3A, 3B, 3C, 3D and 3E several aromatic chemical structures that can be used as starting materials.
Figure 3B:
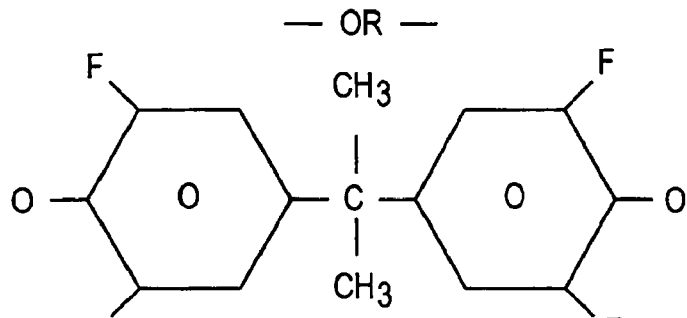
Figure 3C:
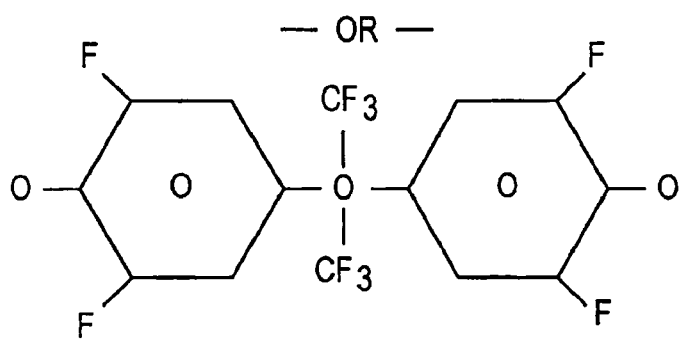
Figure 3D:
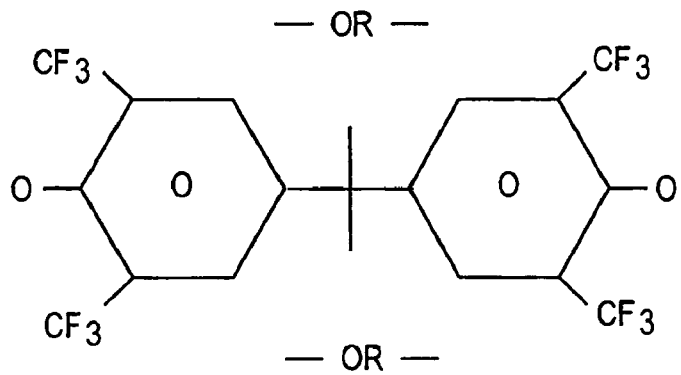
Figure 3E:
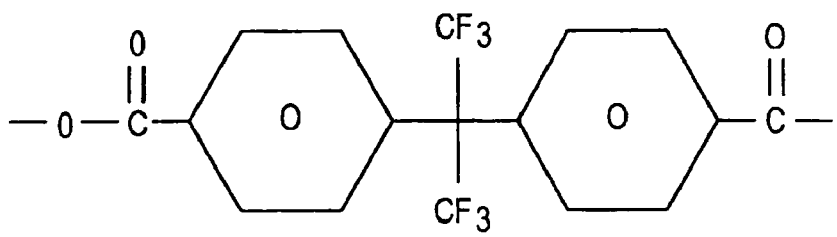

The exposure of selected optical materials to electron beam irradiation can convert the existing material into a new state which exhibits more desirable optical and mechanical properties not present in the un-irradiated material. An example of this can be seen in FIGS. 1 and 2 which shows a plot of surface refractive index as a function of electron dosage and overall thickness respectively in a uniformly irradiated sample as a function of electron dosage for several amorphous fluoropolymers. The new optical material was created only by exposure to the electron beam. The introduction of extra bonds within, in this case, a high polymer results in a large refractive index change. This conversion can be done selectively in three dimensions in either a continuous or periodic manner in normally non-reactive material systems including oil, waxes, monomers, oligomers, and high polymers such that a number of optically useful devices can be easily fabricated.

Typically, the prior art method of forming a waveguide, optical fiber, gradient index lens, diffraction grating beamsplitter, or interference filter required the use of optical polymers containing photoinitiators, subtractive techniques such as reactive ion etching, or bonding dissimilar materials together with glue layers. In the first case, involving the use of photoinitiators because the wavelength of the radiation typically used to activate the photoinitiator systems creates near-field interference patterns (exhibiting textures on the order of the wavelengths trying to be propagated within the device) scattering losses results. These interference patterns are typically superimposed on the guiding structures used in splitters and other optical devices leading to bridging and striation within the films, all of which result in losses. The inventive use of electron beam processes eliminates interference effects since the equivalent wavelength (of the electron beam) is orders of magnitude less than typical optical exposure tools.

The electron beam imparts sufficient energy to the chemical bonds to create scissions, which leads to the formation of additional networking bonds as these reactive entities recombine within the material. The change in refractive index is due to the process of scission and reformation and (to a lesser extent) due to the extraction of low molecular weight components that are volatilized by the e-beam that are removed by the vacuum system. Due to this dual process, conditions can be created in which the index of refraction can be higher or lower than the index of refraction of the starting material cured using conventional means. This allows a wide range of new materials to be selectively created having improved properties for optical applications.

Examples of the optical starting materials that can be converted using this approach include spin-on glasses, polymers, monomers, oligomers, waxes, and oils. These materials do not outgas significantly in soft vacuum (10-50 millitorr). Other optically useful materials include composites and mixtures including inorganic/organic suspensions, polymers containing organometallics, and sol-gels. Since the formation of bonds does not require an additive such as a photoinitiator, the range of available material blends is large.

Preferred optical materials include the following: Typical spin-on glass materials include methylsiloxane, methylsilsesquioxane, phenylsiloxane, phenylsilsesquioxane, methylphenylsiloxane, methylphenylsilsesquioxane, and silicate polymers. Spin-on glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and alkoxyhydridosiloxane or hydroxyhydridosiloxane. Spin-on glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl.

Typical polymer optical materials include halogenated polyalkylenes, preferred fluorinated an/or chlorinated polyalkylens, more preferred chlorofluoropolyalkylens, and most preferred are the fluorinated polyalkylenes among which are included: polytetrafluoroethane (ethylene), polytrifluoroethylene, polyvinylidene fluoride, polyvinylfluoride, copolymers of fluorinated ethylene or fluorinated vinyl groups with non-fluorinated ethylenesor vinyl groups, and copolymers of fluorinated ethylenes and vinyls with straight or substituted cyclic fluoroethers containing one or more oxygens in the ring. Also included in the most preferred polymers are poly(fluorinated ethers) in which each linear monomer may contain from one to four carbon atoms between the ether oxygens and these carbons may be perfluorinated, monofluorinated, or not fluorinated.

Also included in the most preferred polymer optical materials are copolymers of wholly fluorinated alkylenes with fluorinated ethers, partly fluorinated alkylenes with wholly fluorinated ethers, wholly fluorinated alkylenes with partly fluorinated ethers, partly fluorinated alkylenes with partly fluorinated ethers, non-fluorinated alkylenes with wholly or partly fluorinated ethers, and non-fluorinated ethers with partly or wholly fluorinated alkylenes.

Also included among the most preferred polymer optical materials are copolymers of alkylenes and ethers in which one kind of the monomers is wholly or partly substituted with chlorine and the other monomer is substituted with fluorine atoms. In all the above, the chain terminal groups may be similar to those in the chain itself, or different.

Also among the most preferred polymer optical materials are included substituted polyacrylates, polymethacrylates, polyitaconates, polymaleates, and polyfumarates, and their copolymers, in which their substituted side chains are linear with 2 to 24 carbon atoms, and their carbon atoms are fully fluorinated except for the first one or two carbons near the carboxyl oxygen atom such as Fluoroacrylate, Fluoromethacrylate and Fluoroitaconate.

Among the more preferred polymer optical materials, one includes fluoro-substituted polystyrenes, in which the ring may be substituted by one or more fluorine atoms, or alternatively, the polystyrene backbone is substituted by up to 3 fluorine atoms per monomer. The ring substitution may be on ring carbons No. 4, 3, 2, 5, or 6, preferably on carbons No. 4 or 3. There may be up to 5 fluorine atoms substituting each ring.

Among the more preferred polymer optical materials, one includes aromatic polycarbonates, poly(ester-carbonates), polyamids and poly(esteramides), and their copolymers in which the aromatic groups are substituted directly by up to four fluorine atoms per ring one by one on more mono or trifluoromethyl groups such as shown in FIGS. 3A, 3B, 3C, 3D and 3E.

Among the more preferred polymer optical materials, are fluoro-substituted poly(amic acids) and their corresponding polyimides, which are obtained by dehydration and ring closure of the precursor poly(amic acids). The fluorine substitution is effected directly on the aromatic ring. Fluoro-substituted copolymers containing fluoro-substituted imide residues together with amide and/or ester residues are included.

Also among the more preferred polymer optical materials are parylenes, fluorinated and non-fluorinated poly(arylene ethers), for example the poly(arylene ether) available under the tradename FLARE™ from AlliedSignal Inc., and the polymeric material obtained from phenyl-ethynylated aromatic monomers and oligomers provided by Dow Chemical Company under the tradename SiLK™, among other materials.

In all the above, the copolymers may be random or block or mixtures thereof.

Figure 4:
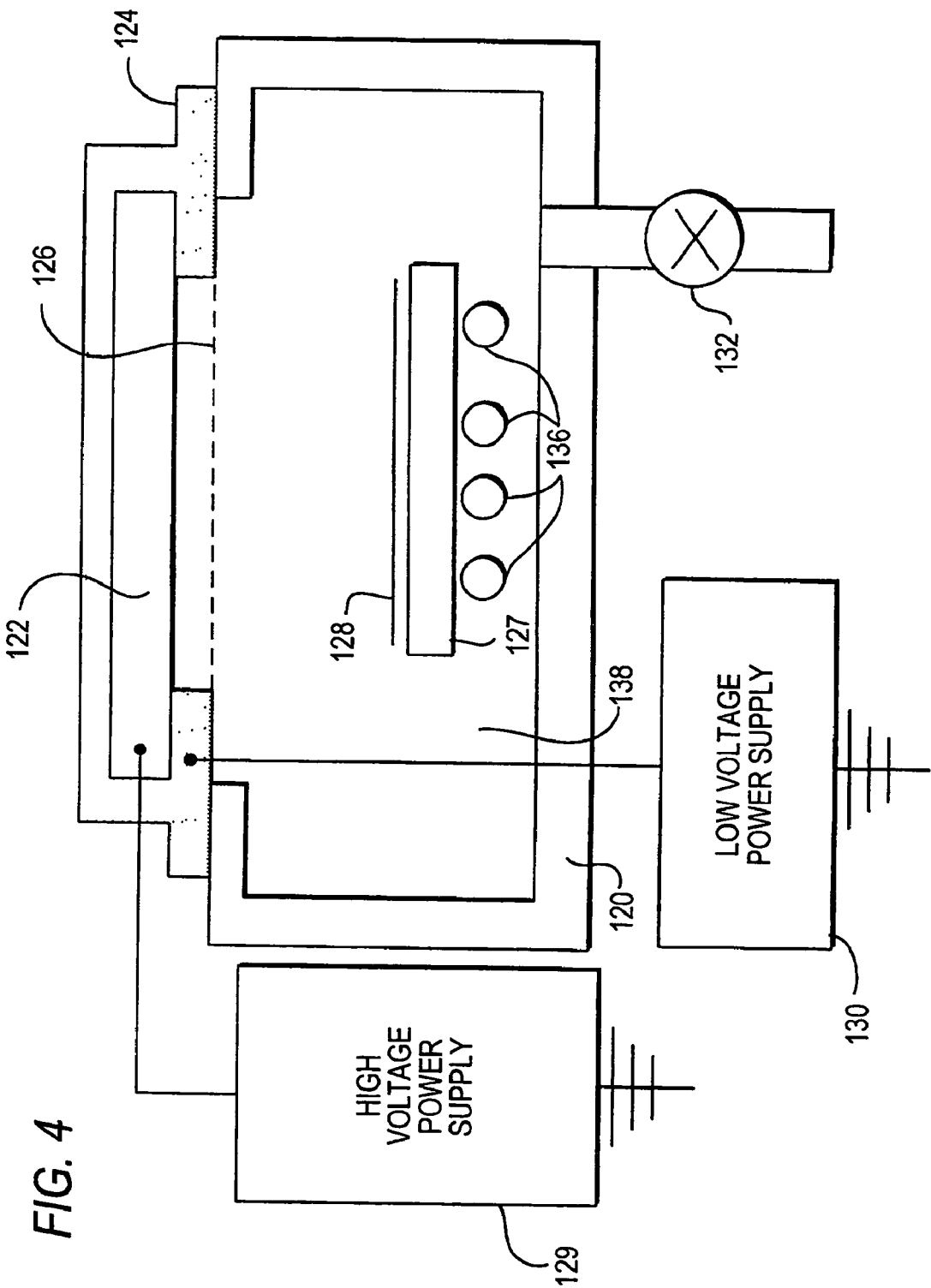
FIG. 4 shows a schematic view of a large area electron beam exposure apparatus.
Figure 5:
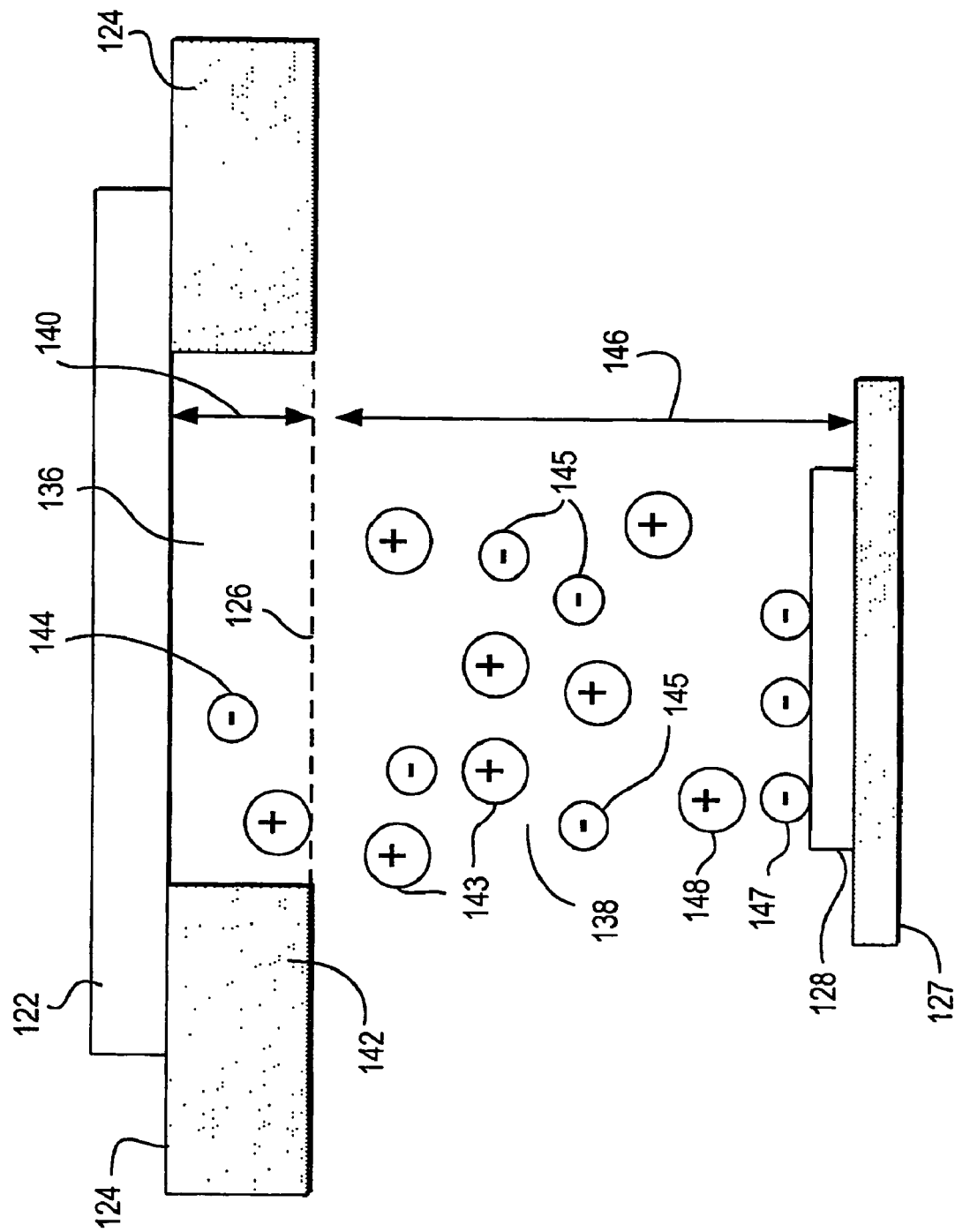
FIG. 5 shows the operation of the electron source.

The method of creating optical materials with changed refractive indexes from these conventional spin-on glass and polymer materials, according to the present invention, is depicted in FIGS. 4 and 5. A substrate 127 is placed in a vacuum chamber 120 at a pressure of 15 to 40 millitorr and underneath an electron source at a distance from the source sufficient for the electrons to generate ions in their transit between the source and the substrate surface. The electrons can be generated from any type of source that will work within a soft vacuum (15 to 40 milliTorr) environment. A source particularly well suited for this is described in U.S. Pat. No. 5,003,178, the disclosure of which is hereby incorporated into this specification by reference. This is a large uniform and stable source that can operate in a soft vacuum environment. The cathode 122 emits electrons. The electrons are accelerated by the field between the cathode and anode 126. The potential between these two electrodes is generated by the high voltage supply 129 applied to the cathode 122 and the bias voltage supply 130 applied to the anode 126. The electrons irradiate the starting optical material layer 128 coated on the substrate 127. The starting optical material layer 128 may be any of the materials previously mentioned or the spin-on glass or polymer materials described above. An electron energy is selected to either fully penetrate or partially penetrate the full thickness of starting optical material layer 128. For example, a large area electron beam energy of 9 keV is used to penetrate a 6000 Angstrom thick film. Infrared quartz lamps 136 irradiate the bottom side of the substrate providing heating independent from the electron beam. A variable leak valve or mass flow controller, identified by reference 132, is utilized to leak in a suitable gas to maintain the soft vacuum environment.

Referring to FIG. 5, electrons 145 traversing the distance 146 between the anode 126 and the substrate 127 ionize the gas molecules located in region 138 generating positive ions. These positive ions 143 are then attracted back to the anode 126 where they can be accelerated, as indicated at 142, toward the cathode to generate more electrons. The starting optical material layer 128 on the substrate 127 is an insulator and will begin to charge negatively, as indicated at 147, under electron bombardment. However, the positive ions near the substrate surface will be attracted to this negative charge and will then neutralize it. The lamps 136 (FIG. 4) irradiate and heat the starting optical material layer or substrate thereby controlling its temperature. Since the starting optical material layer is in a vacuum environment and thermally isolated, the starting optical material layer can be heated or cooled by radiation. If the lamps are extinguished, the starting optical material layer will radiate away its heat to the surrounding surfaces and gently cool. In one embodiment of the invention, the starting optical material layer is simultaneously heated by the infrared lamps and irradiated by the electron beam throughout the entire process.

In the present method, a solution containing a spin-on glass or polymer material is deposited on substrate 127 by conventional means such as spin-coating or, alternatively, spray-coating or dip-coating to form starting optical material layer 128. Substrate 127 represents any layer or stack of layers on a multiple-optical layer device. The coated substrate is continuously irradiated with electrons until a sufficient dose has accumulated to attain the desired change in the material and affect starting optical material layer properties such as refractive index. A total dose of between 10 and 100,000 micro-Coulombs per square centimeter ($\mu C/cm^2$) may be used. Preferably, a dose of between 100 and 10,000 $\mu C/cm^2$ is used, and most preferably a dose of between about 2,000 and 5,000 $\mu C/cm^2$ is used. The electron beam is delivered at an energy of between 0.1 and 100 keV, preferably at an energy between 0.5 and 20 keV, and most preferably at an energy between 1 and 10 keV. The electron beam current ranges between 0.1 and 100 mA, and more preferably between 0.25 and 30 mA. The entire electron dose may be delivered at a single voltage. Alternatively, particularly for starting optical material layers thicker than about 0.25 μm, the dose is divided into steps of decreasing voltage, which provides a "uniform dose" process in which the material is irradiated from the bottom up. The higher energy electrons penetrate deeper into the starting optical material layer. In this way, the depth of electron beam penetration is varied during the electron exposure process resulting in a uniform energy distribution throughout the starting optical material layer. The variation allows for volatile components, such as solvent residues, to leave the starting optical material layer without causing any damage such as pinholes or cracks. This also attains uniform refractive index throughout the layer exposed. Alternatively, the electron energy can be varied to achieve a precise dose and refractive index change spatially within the material.

During the electron beam exposure process, the starting optical material layer is kept at a temperature between 10 degrees Celsius and 1000 degrees Celsius. Preferably, the wafer temperature is between 30 degrees Celsius and 500 degrees Celsius. For some waxes and other low melting point materials low temperatures are utilized (25 degrees to 175 degrees Celsius). The infrared quartz lamps 36 are on continuously until the starting optical material layer temperature reaches the desired process temperature. The lamps are turned off and on at varying duty cycle to control the starting optical material layer temperature. Typical background process gases in the soft vacuum environment include nitrogen, argon, oxygen, ammonia, forming gas, helium, methane, hydrogen, silane, and mixtures thereof. For many starting optical materials, a non-oxidizing processing atmosphere is used. For other applications, an oxidizing atmosphere would be appropriate. The optimal choice of electron beam dose, energy, current, processing temperature, and process gas depends on the composition of the starting optical material, spin-on glasses or polymer material.

The optical starting material may be deposited onto a suitable substrate. Typical substrates include glass, silicon, metal, and polymer films. Substrates can also be porous, textured or embossed. Deposition on substrates may be conducted via conventional spin coating, dip coating, roller coating, spraying, embossing, chemical vapor deposition methods, or meniscus coating methods, which are well known in the art. Spin coating on substrates is most preferred. Multiple layers of the same optical materials are also preferred. Layer thicknesses typically range from 0.01 to 20 microns. 1 to 10 microns is preferred. In another embodiment of the invention, the optical starting material is formed into a supported film similar to pellicles used in semiconductor applications. In this case, starting optical material layers may be formed by casting, spin coating, and dip coating, lifted off the substrate and attached to a frame for handling. In addition, extruded starting optical material layers can be attached to a frame, all of which are well known in the art. Casting, with lift-off and frame attachment is preferred. Single starting optical material layers exhibit thicknesses ranging from 1 micron to 10 microns. Once the article has been formed, the exposure equipment needs to be selected.

Exposure of the starting optical material layer can be done with any type of low energy electron source, preferably in the range of 1 to 50 keV. Soft vacuum (15 to 40 milliTorr) is also preferred for removal of volatiles and usage of low keV electrons. In the preferred embodiment of this invention, the starting optical material, either on a substrate or as supported film, is selectively exposed to the electron beam and heated using the IR lamps. Selective heating is also preferred. The IR lamps typically operate from room temperature to 400 degrees Celsius. Most optical materials exhibit different e-beam irradiation responses depending on the temperature of the material. In-situ monitoring of the exposure process is included in this invention such as monitoring grating spectral response concerning side lobes during exposure. Other functions such as transmission loss, polarization sensitivity, and back reflections can all be monitored during exposure and used in a feedback loop to the exposure parameters. In-situ feedback during exposure is an embodiment of this invention. Various gases can be introduced during the irradiation process. It has been shown that these gases can be reacted into the starting optical material layer depending on the material and exposure conditions. Introduction of a reactive or non-reactive gas into the starting optical material layer during exposure is a further embodiment of this invention. Radial exposure conditions, as well as other non-flat configurations, are embodiments of this invention as well as modification of the electron field using external means such as magnetic fields. Once the equipment is selected, the exposure conditions are selected.

Typically the starting optical material layer is exposed to a sequential series of kinetic energies generating a particular distribution of bond densities within the optically useful material. Based on the optical material's particular e-beam response, temperature distribution within the material, kinetic energy distribution of the electrons, and density of the material, a range of refractive index changes can be generated. Preferred starting optical material layer change includes 3 dimensional complex index of refraction. Exposure can be done through an aperture mask as known in the art or by embossing or forming an absorptive mask directly on the starting optical material layer or on a thin carrier film support above the starting optical material layer. In the case of starting optical material layers, dual sided processing can be used. The mask can be either sacrificial or permanent depending on the application. In this embodiment of the invention, rather than forming a binary system a gradient of exposure can be generated.

Figure 6A:
FIG. 6 shows a schematic view of representative embossed structures 6A, 6B and 6C.
Figure 6B:
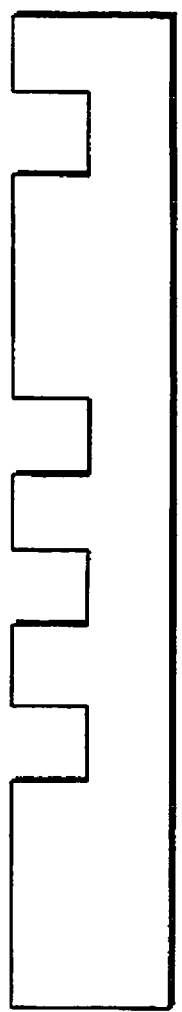
Figure 6C:

As shown in FIG. 6, a variety of starting optical material layer structures can be formed using embossing or photolithography steps known in the art. During exposure the areas covered by the mask would proportionally absorb electrons as a function of the embossed thickness. As stated earlier, both the dosage and energy distribution is affected by this approach. But it has been demonstrated that a variety of gradient structures can be generated using this patterning technique and a number of the examples include this approach. In addition, because the starting optical material layer or a thin membrane supports the mask, multiple sequential masks are not required. In the case of embossed or textured starting materials, the need for a mask can be totally eliminated. The embossed structure is irradiated such that the penetration depth is less than feature height. The result is a region of higher refractive index on pedestal after overcoating the resulting waveguide structure appears. In addition, a waveguide can be created on a grating surface. Because the irradiation condition determines the penetration depth, the resulting waveguide will follow the rapid modulation in the grating. Multiple layered configurations are also embodiments of this invention and will be shown in some of the following examples as will the use of this technique to couple closely spaced waveguides and other optical devices. A further embodiment involves the use of the proximity effect to directly form tapered waveguides. Due to spreading as a function a depth that occurs, an array of micro-optical waveguides can be formed in a film. Once the sample is exposed, fabrication into a device can commence.

The electron beam apparatus and method can be used to change the refractive index for an entire layer of optical material.

Figure 7A:
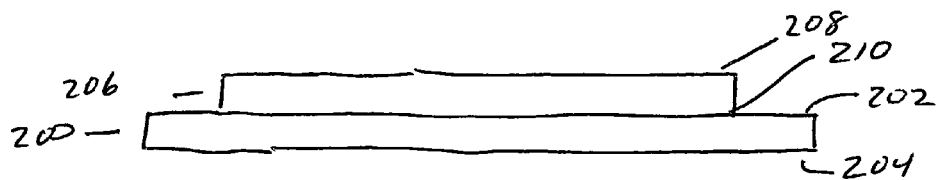
FIG. 7 shows in FIGS. 7A, 7B, and 7C schematic views of forming an optical material layer with a higher refractive index.

As shown in FIG. 7A, the substrate 200 has an upper surface 202 and a lower surface 204. The starting optical material layer 206 has an upper surface 208 and a lower surface 210. The lower surface 210 of the starting optical material layer is deposited, bonded, coated, or otherwise positioned on the upper surface 202 of the substrate. The starting optical material layer 206 will have an original index of refraction $n_0$.

Figure 7B:
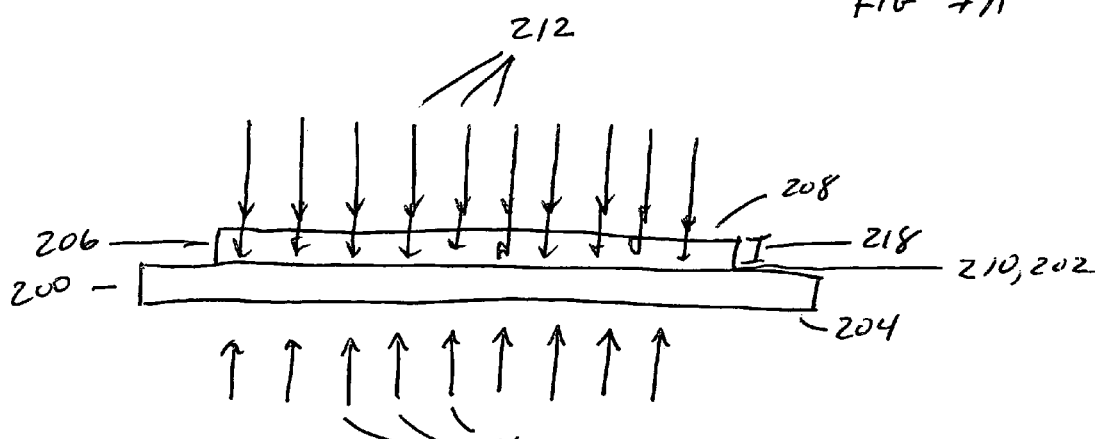

As shown in FIG. 7B, a large area electron beam 212 is incident at a perpendicular angle to the upper surface 208 of the optical material layer 206 and irradiates the optical material layer. Infrared radiation beams 214 will heat the substrate 200 through the lower surface 204 and, by heat transfer through the substrate, will heat the starting optical material 206. The electron beam 212 fully penetrates the depth or thickness 218 of the optical material layer to the lower surface 210 of the optical material layer 206 and the upper surface 202 of the substrate 200.

Figure 7C:
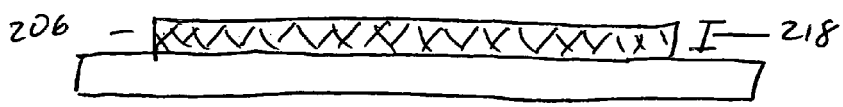

As shown in FIG. 7C, the entire optical material layer 206, after electron beam irradiation and heating, will have a uniform index of refraction $n_1$, which is higher than the original index of refraction $n_0$ of the starting optical material layer, through the full thickness 218 of the optical material layer.

Alternately, the electron beam irradiation can form a gradient index of refraction from $n_{0.1}$ to $n_1$ within the optical material layer 206. The index of refraction will increase from the lower surface 210 to the upper surface 208. The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a gradient index of refraction within the starting optical material.

The optical material layer can be removed from the substrate by conventional chemical, etching or physical means. Alternately, a release layer (not shown in this Figure) can be deposited on the substrate and the starting optical material layer can be deposited on the release layer. The electron beam radiation and heat radiation will pass through the release layer without effecting the release layer or the transformation of the starting optical material layer. After the transformation process, the optical material layer can be lifted off the substrate by dissolving the release layer.

The electron beam apparatus and method can provide a layer of one refractive index integral and adjacent to a layer of another refractive index with both layers formed of the same optical material.

Figure 8A:
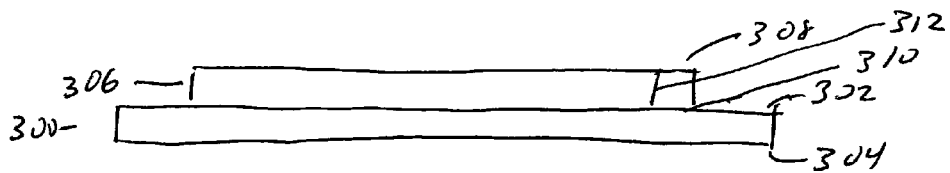
FIG. 8 shows in FIGS. 8A, 8B, 8C and 8D schematic views of forming an interference filter.

As shown in FIG. 8A, the substrate 300 has an upper surface 302 and a lower surface 304. The starting optical material layer 306 has an upper surface 308 and a lower surface 310. The lower surface 310 of the starting optical material layer is deposited, bonded, coated, or otherwise positioned on the upper surface 302 of the substrate. The starting optical material layer 306 will have an original index of refraction $n_0$ and a thickness 312.

Figure 8B:
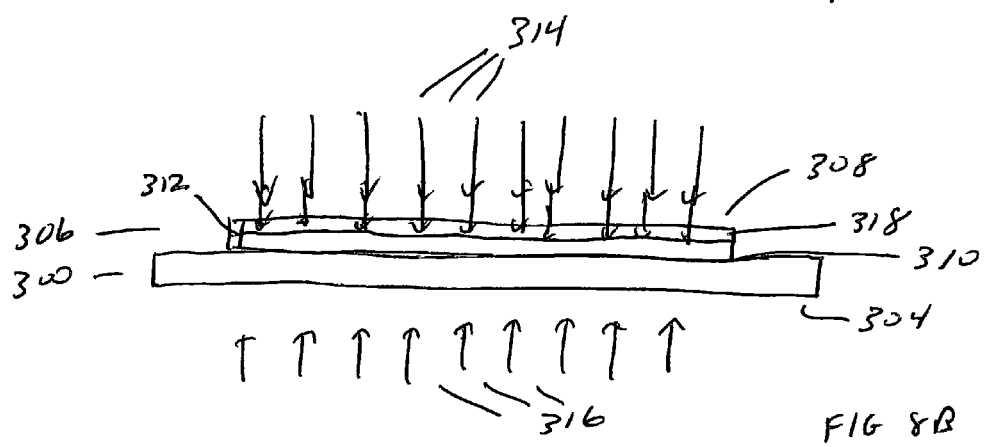

As shown in FIG. 8B, a large area electron beam 314 is incident at a perpendicular angle to the upper surface 308 of the optical material layer 306 and irradiates the optical material layer. Infrared radiation beams 316 will heat the substrate 300 through the lower surface 304 and, by heat transfer through the substrate, will heat the starting optical material 306. The electron beam 314 partially penetrates the optical material layer to a depth or thickness 318 from the upper surface 308 between the upper surface 308 and the lower surface 310 of the optical material layer. The penetration depth 318 is less than the thickness 312 of the optical material layer.

Figure 8C:
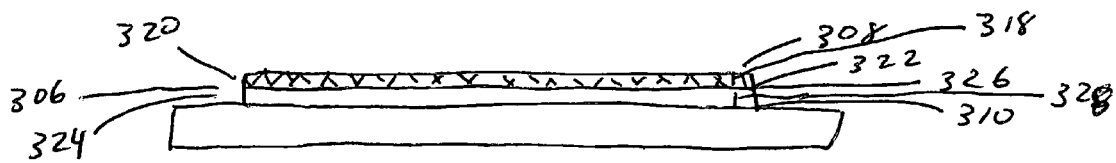

As shown in FIG. 8C, the partial penetration of the electron beam irradiation divides the optical material into a first sub-layer and a second sub-layer. The optical material layer 306 has a second or upper sub-layer 320 having an upper surface 308 and a lower surface 322 and a first or lower sub-layer 324 having an upper surface 326 and a lower surface 310. The lower surface 322 of the upper sub-layer is on the upper surface 326 of the lower sub-layer. The lower surface 310 of the lower sub-layer is on the upper surface 302 of the substrate. Since the starting optical material layer is one layer, after electron beam irradiation, the second sub-layer is integral and positioned adjacent and on top of the first sub-layer within the optical material layer.

The second or upper optical material sub-layer 320 will have an index of refraction $n_1$, which is higher than the original index of refraction $n_0$ of the starting optical material layer 306. The lower surface 322 of the upper sub-layer is at the irradiation penetration depth 318 of the electron beam. The upper sub-layer will have a thickness equivalent to the penetration depth of the electron beam.

The first or lower optical material sub-layer 324, which was not irradiated by the electron beam, has the original index of refraction $n_0$ of the starting optical material 306. The lower sub-layer will have a thickness 328 equivalent to the original thickness 312 of the starting optical material less the thickness 318 of the upper sub-layer.

The optical material layer will have a second sub-layer with a high refractive index on top of a first sub-layer with a lower refractive index without fabrication by deposition, without an intervening adhesive layer between the two sub-layers, and with both sub-layers being formed from the same optical material.

The depth of the penetrating electron beam and the resulting thickness of the altered refractive index layer are determined by the dose, voltage and duration of the electron beam and accordingly can vary from the upper surface of the starting optical material layer to the lower surface of the starting optical material layer.

The second or upper sub-layer 320 can alternately have a gradient index of refraction. The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a gradient index of refraction within the starting optical material.

Figure 8D:
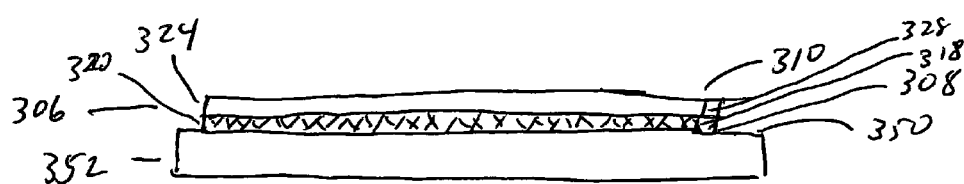

As shown in FIG. 8D, the optical material layer 306 can be removed from the substrate by conventional chemical, etching or physical means. Alternately, a release layer (not shown in this Figure) can be deposited on the substrate and the starting optical material layer can be deposited on the release layer. The electron beam radiation and heat radiation will pass through the release layer without effecting the release layer or the transformation of the starting optical material layer. After the transformation process, the optical material layer can be lifted off the substrate by dissolving the release layer.

The optical material layer 306 will be inverted and deposited, bonded or positioned on the surface 350 of an optical element 352. The upper surface 308 of the second sub-layer will be attached to the upper surface 350 of the optical element. The lower surface 310 of the first sub-layer will be the outer surface of then optical material on the optical element. The second sub-layer 324 is adjacent to the optical element 350 with the first sub-layer 320 being on the outside.

The sequence will be optical element 350, the second sub-layer 320 with a high refractive index and the first sub-layer 324 with a low refractive index. If the optical thickness 318 of the second sub-layer 320 and the optical thickness 328 of the first sub-layer 324 are in quarter-wavelengths or whole number multiples of quarter wavelengths for the light transmitted through or reflected from the optical element, the two sub-layers of the optical material will form an interference filter which can be an anti-reflection coating for the optical element or a heat reflective thermal control layer for the optical element or a wavelength sensitive reflectance/transmittance interference filter for the optical element 352.

An interference filter is formed by a high refractive index material layer on a substrate with a low refractive index material layer on the high refractive index material layer. The antireflection coating reduces reflected light by decreasing the refractive index difference between the optical element next to the adjacent high refractive layer and the ambient atmosphere next to the low refractive index layer. The heat reflective thermal control film transmits visible radiation while reflecting infrared radiation. The wavelength sensitive reflectance/transmittance interference filter can reflect or transmit selected wavelengths of light or reflect or transmit ranges of wavelengths of light.

The electron beam apparatus and method of the present invention allows the thickness of the low refractive sub-layer of the optical material and the thickness of the high refractive sub-layer of the same optical material to be individually selected for use in an optical element. The thicknesses can be fractions of wavelengths or ratios to each other.

Figure 9A:
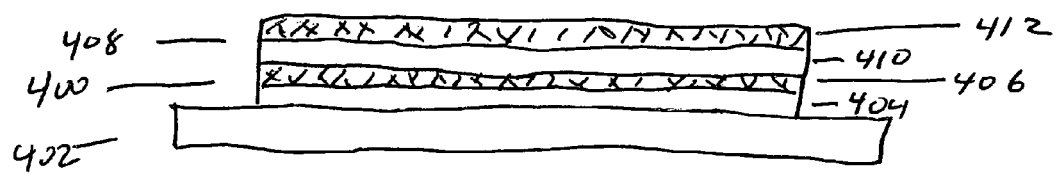
FIG. 9 shows in FIGS. 9A and 9B schematic views of forming a multiple layer interference filter.

As shown in FIG. 9A, a first starting optical material layer 400 is bonded, deposited, coated or positioned on a substrate 402. A large area electron beam (not shown) irradiates the first starting optical material layer while infrared beams (also not shown) heat the substrate and first starting optical material layer. The first optical material layer 400 will form a low refractive index sub-layer 404 and a high refractive index sub-layer 406.

A second starting optical material layer 408 is bonded, deposited, coated or positioned on the high refractive index sub-layer 406 of the first starting optical material layer 400. A large area electron beam (not shown) irradiates the second starting optical material layer while infrared beams (also not shown) heat the second starting optical material layer. The second optical material layer 408 will form a low refractive index sub-layer 410 and a high refractive index sub-layer 412.

Figure 9B:
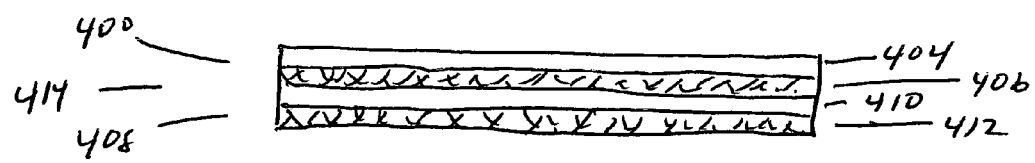

As shown in FIG. 9B, the first and second starting optical material layers 400 and 408 with the sub-layers can be removed from the substrate by the use of a release layer or by conventional chemical, etching or physical means and inverted to form an optical element 414.

The resulting optical element 414 has alternating layers of high and low refractive index materials. The optical element can have multiple optical material layers with multiple alternating layers of high and low refractive index materials formed by the electron beam apparatus and method of the present invention.

The starting optical material layers for the optical element can be the same with the low refractive sub-layers sharing the same original index of refraction. The high refractive sub-layers can have the same or different indexes of refraction. The electron beam apparatus and method can form different indexes of refraction for the same optical material based on the temperature of the substrate supporting the starting optical material, the voltage of the electron beam, the dose of the electron beam, the duration and number of steps of the electron beam, and the use of oxidizing or non-oxidizing gases in the low vacuum atmosphere.

As noted earlier, the thicknesses of the layers of high and low refractive index materials can be individually selected for each sub-layer in the optical element. The optical element can have layers of the original starting optical material without its refractive index changed and solid layers (without sub-layers) of optical material with a raised refractive index like the optical material 206 of FIG. 7.

The starting optical material layers in the optical element can be different optical materials providing different refractive indexes for the alternating layer of high and low refractive index materials.

The optical element of multiple optical material layers with multiple alternating layers of high and low refractive index materials, with a range of refractive indexes and thicknesses and optical materials, can be used as a conventional diffraction grating, a conventional interference filter, or a conventional beam-splitter, as is known in the art.

The optical element of multiple optical material layers with multiple alternating layers of high and low refractive index materials can be used as an interference filter, which can be an anti-reflection coating or a heat reflective thermal control layer or a wavelength sensitive reflectance/transmittance interference filter.

The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a gradient index of refraction within the optical material.

The electron beam apparatus and method can provide adjacent integral multiple layers of different increasing refractive indexes with the multiple layers formed of the same optical material.

Figure 10A:
FIG. 10 shows in FIGS. 10A, 10B, 10C, 10D and 10E schematic views of forming an optical material layer with multiple higher refractive indexes.

As shown in FIG. 10A, the substrate 500 has an upper surface 502 and a lower surface 504. The starting optical material layer 506 has an upper surface 508 and a lower surface 510. The lower surface 510 of the starting optical material layer is deposited, bonded, coated, or otherwise positioned on the upper surface 502 of the substrate. The starting optical material layer 506 will have an original index of refraction $n_0$ and a thickness 512.

Figure 10B:
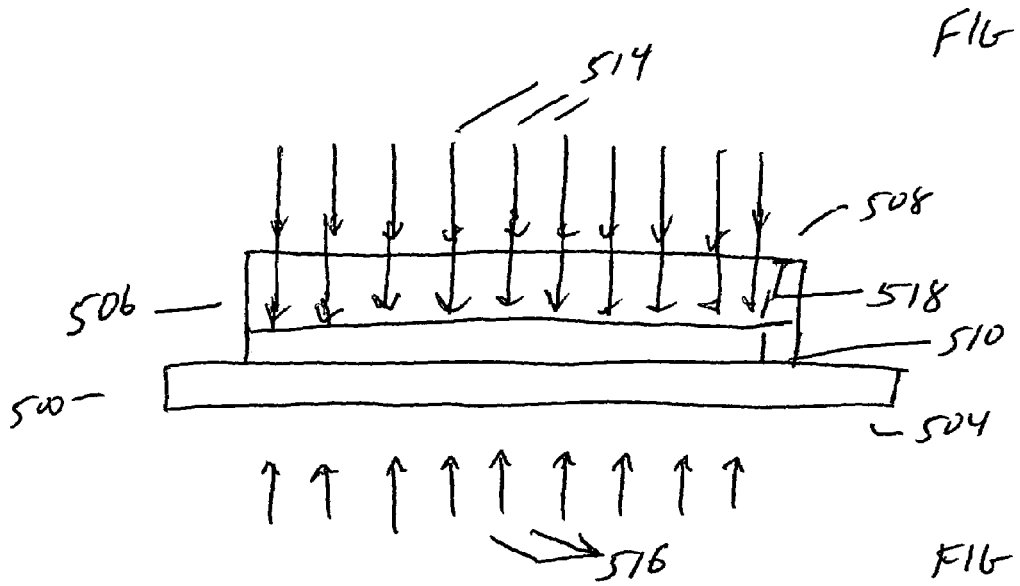

As shown in FIG. 10B, a first large area electron beam 514 is incident at a perpendicular angle to the upper surface 508 of the optical material layer 506 and irradiates the optical material layer. Infrared radiation beams 516 will heat the substrate 500 through the lower surface 504 and, by heat transfer through the substrate, will heat the starting optical material 506. The first electron beam 514 partially penetrates the optical material layer to a depth or first thickness 518 from the upper surface 508 between the upper surface 508 and the lower surface 510 of the optical material layer. The first penetration depth 518 is less than the thickness 512 of the optical material layer.

Figure 10C:
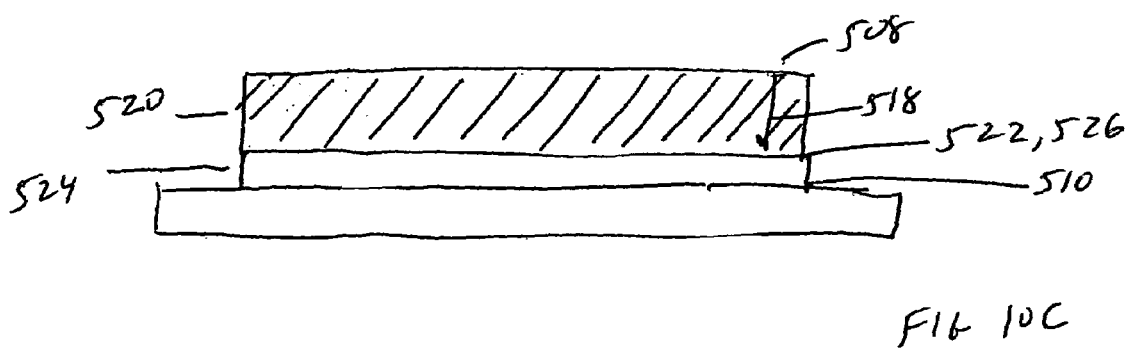
Figure 10:
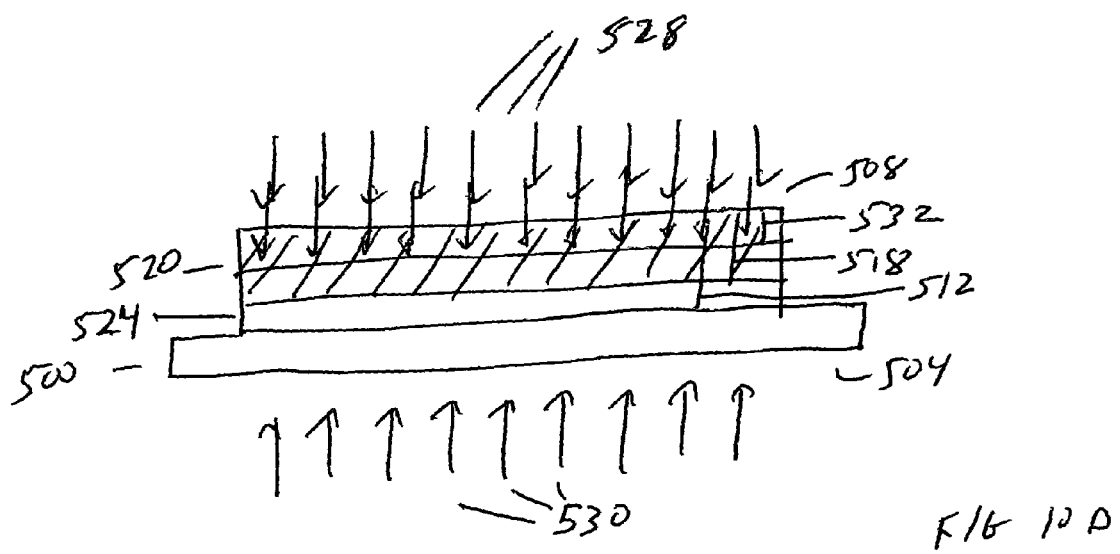
Figure 10:
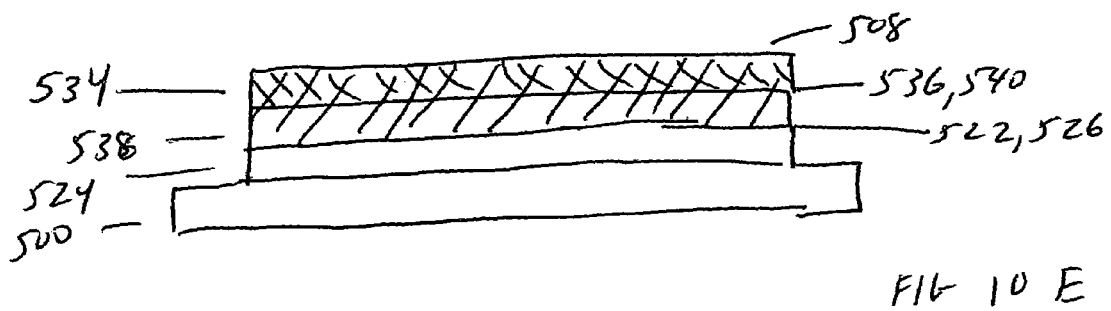

As shown in FIG. 10C, the partial penetration of the electron beam irradiation divides the optical material into a first sub-layer and a transitional sub-layer. The optical material layer 506 has a transitional or upper sub-layer 520 having an upper surface 508 and a lower surface 522 and a first or lower sub-layer 524 having an upper surface 526 and a lower surface 510. The lower surface 522 of the transitional sub-layer is on the upper surface 526 of the lower sub-layer. The lower surface 510 of the lower sub-layer is on the upper surface 502 of the substrate.

The transitional sub-layer 520 will have an index of refraction $n_1$, which is higher than the original index of refraction of the starting optical material layer 506. The lower surface 522 of the transitional sub-layer is at the first irradiation penetration depth 518 of the electron beam. The first sub-layer 524, which was not irradiated by the electron beam, has the original index of refraction $n_0$ of the starting optical material 506.

As shown in FIG. 10D, a second large area electron beam 528 is incident at a perpendicular angle to the upper surface 508 of the transitional sub-layer 520 and irradiates the optical material in the transitional sub-layer. Infrared radiation beams 530 will heat the substrate 500 through the lower surface 504 and, by heat transfer through the substrate 500 and the first sub-layer 524, will heat the transitional sub-layer 520.

The second electron beam 528 partially penetrates the optical material of the transitional sub-layer layer 520 to a depth or second thickness 532 from the upper surface 508 between the upper surface 508 of the transitional sub-layer 526 and the upper surface of the first sub-layer 524. The second irradiation penetration depth 532 is less than the thickness of the optical material 512 and is less than the first irradiation penetration depth 518. The second electron beam 528 does not penetrate the first sub-layer 524, only partially penetrating the transitional sub-layer 520.

As shown in FIG. 10E, the partial penetration of the second electron beam irradiation divides the transitional sub-layer of optical material into a second sub-layer and a third sub-layer. The optical material will have a third or upper sub-layer 534 having an upper surface 508 and a lower surface 536 and a second or middle sub-layer 538 having an upper surface 540 and a lower surface 522. The lower surface 536 of the third sub-layer 534 is on the upper surface 540 of the second sub-layer 538. The lower surface 522 of the second sub-layer 538 is on the upper surface 526 of the first sub-layer 524.

Since the starting optical material layer is one layer, after electron beam irradiation, the third, second and first sub-layer are integral with third sub-layer positioned adjacent to and on top of the second sub-layer and the second sub-layer positioned adjacent to and on top of the first sub-layer within the optical material layer.

The third sub-layer 534 will have an index of refraction $n_2$, which is higher than the index of refraction $n_1$ of the second sub-layer 538, and higher than the index of refraction $n_0$ of the first sub-layer 524 and the starting optical material layer 506. The lower surface 536 of the third sub-layer 534 is at the second irradiation penetration depth 518 of the electron beam. The third sub-layer 534 has been exposed to the first and second electron beam. The second sub-layer 538 has only been exposed to the first electron beam. The first sub-layer 524, which was not irradiated by the second electron beam nor the first electron beam, has the original index of refraction $n_0$ of the starting optical material 506.

The third sub-layer 534 will have a thickness equivalent to the second penetration depth 532 of the second electron beam. The second sub-layer 538 will have a thickness equivalent to the first penetration depth 518 of the first electron beam less the second penetration depth 532 of the second electron beam. The first sub-layer 524 will have a thickness equivalent to the original thickness 512 of the starting optical material less the thickness of the second and third sub-layers (or equivalent to the original thickness of the starting optical material 512 less the thickness of the first penetration depth 518).

The optical material 506 has a first or lower sub-layer 524 with a first index of refraction, a second or middle sub-layer 538 with a second index of refraction higher than the first index of refraction and a third or upper sub-layer 534 with a third index of refraction higher than the second index of refraction and higher than the first index of refraction.

The optical material layer 506 has sub-layers of progressively higher indexes of refraction without fabrication by deposition, without an intervening adhesive layer between the layers, and with all the layers being formed from the same material.

The optical material layer 506 can be removed from the substrate by conventional chemical, etching, physical means or the use of a release layer, as discussed previously. After release, the optical material layer can be inverted. The inverted optical material layer 506 has sub-layers of progressively lower indexes of refraction without fabrication by deposition, without an intervening adhesive layer between the layers, and with all the layers being formed from the same material.

The optical material layer 506 can be used as an interference filter, as discussed previously or formed into multiple alternating layers to be used as a diffraction grating or beamsplitter, also as discussed previously.

The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a gradient index of refraction within the starting optical material.

Alternately, the multiple electron beam irradiation can form multiple sub-layers of increasing uniform or gradient indexes of refraction with each sub-layer having an index of refraction greater than the original index of refraction $n_0$ of the starting optical material. There would be no sub-layers of just the original starting optical material. Every sub-layer would be irradiated with electron beams to increase its index of refraction.

Figure 11A:
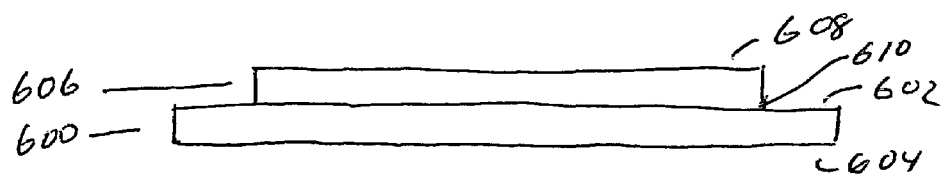
FIG. 11 shows in FIGS. 11A, 11B, and 11C schematic views of forming an optical material layer with a higher gradient refractive index.

As shown in FIG. 11A, the substrate 600 has an upper surface 602 and a lower surface 604. The starting optical material layer 606 has an upper surface 608 and a lower surface 610. The lower surface 610 of the starting optical material layer is deposited, bonded, coated, or otherwise positioned on the upper surface 602 of the substrate. The starting optical material layer 606 will have an original index of refraction $n_0$.

Figure 11B:
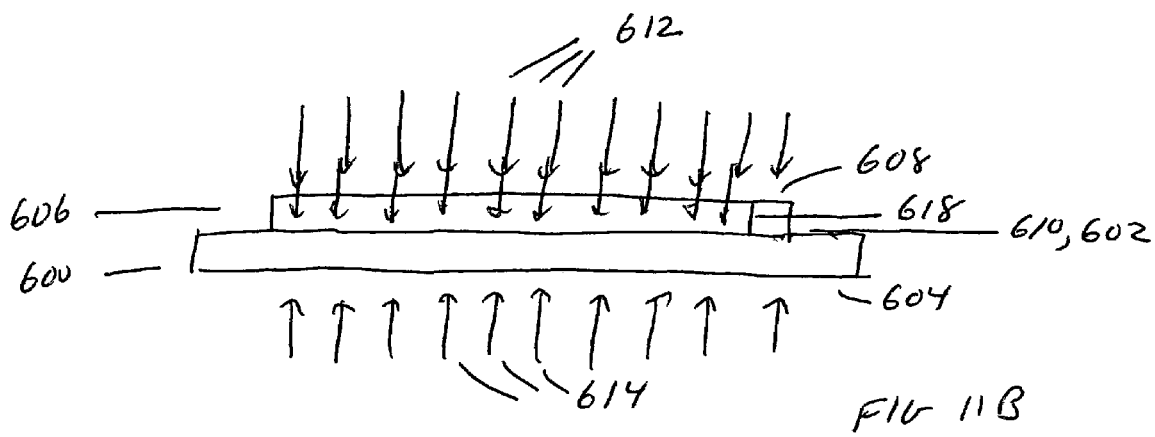

As shown in FIG. 11B, a large area electron beam 612 is incident at a perpendicular angle to the upper surface 608 of the optical material layer 606 and irradiates the optical material layer. Infrared radiation beams 614 will heat the substrate 600 through the lower surface 604 and, by heat transfer through the substrate, will heat the starting optical material 606. The electron beam 612 fully penetrates the depth or thickness 618 of the optical material layer to the lower surface 610 of the optical material layer 606 and the upper surface 602 of the substrate 600.

The electron beam provides precisely controlled electron doses at selected energies at differing relative depths causing an unequal distribution of electron energy along the depth of the starting optical material which results in varying indexes of refraction along the depth of the material.

Figure 11C:
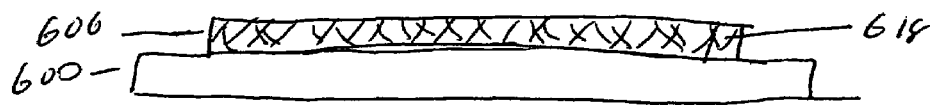

As shown in FIG. 11C, the entire optical material layer 606, after electron beam irradiation and heating, will have a gradient index of refraction which varies from $n_1$ to $n_2$ by depth, with the upper refractive index $n_2$ closer to the upper surface being higher than the lower refractive index $n_1$ closer to the lower surface. Both refractive indexes $n_1$ to $n_2$ are higher than the original index of refraction $n_0$, through the full depth 618 of the optical material layer.

The refractive index of the optical material 606 of FIG. 8 can vary by progressions other than straight line gradient, such as exponential or logarithmic, which are illustrative examples but not an exhaustive list of examples.

An embossing structure can be used with the electron beam apparatus and method to pattern the refractive index areas within the same optical material layer.

Figure 12A:
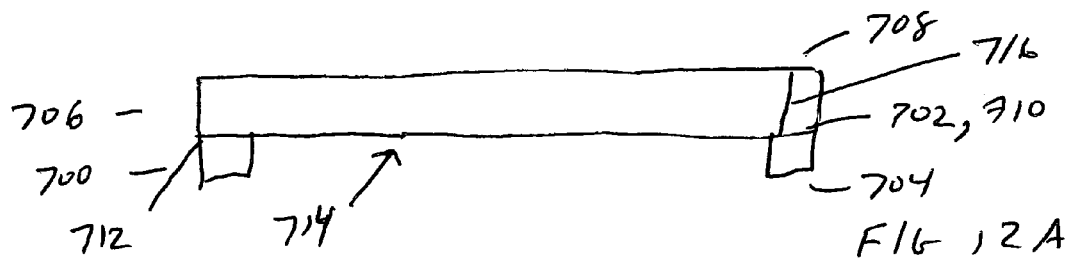
FIG. 12 shows in FIGS. 12A, 12B, and 12C schematic views of forming a microlens array.

As shown in FIG. 12A, the substrate 700 is a support ring with an upper surface 702 and a lower surface 704. The starting optical material layer 706 has an upper surface 708 and a lower surface 710. A small portion 712 of the lower surface 710 of the starting optical material layer is deposited, bonded, coated, or otherwise positioned on the upper surface 202 of the substrate support ring. A large portion 714 of the lower surface 710 of the starting optical material layer remains exposed. The support ring can substitute for a substrate layer in this and other embodiments of the present invention. The starting optical material layer 706 will have an original index of refraction $n_0$ and a thickness 716.

Figure 12B:
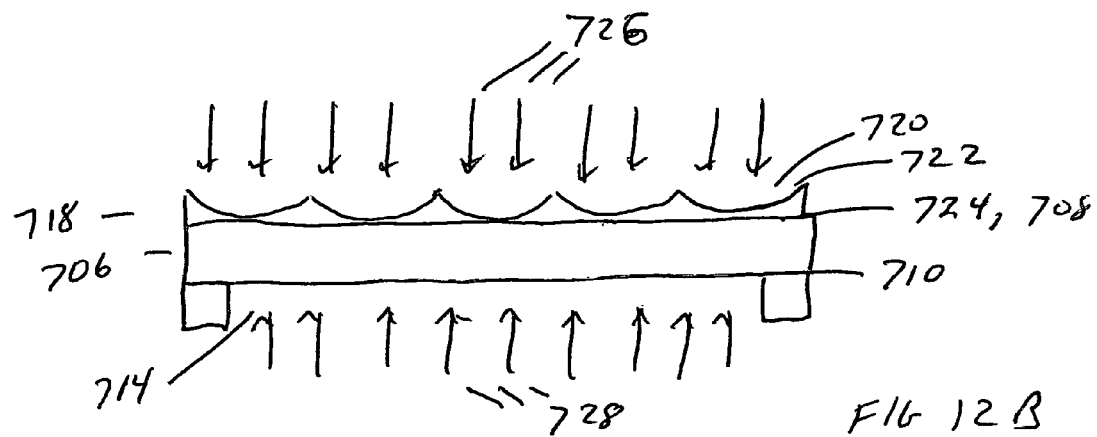

As shown in FIG. 12B, an embossed structure 718 is formed of photoresist and has a series of concave surfaces 720 on its upper surface 722. The lower surface 724 of the embossed structure 718 is flat and deposited or positioned on the upper surface 708 of the starting optical material 706.

A large area electron beam 726 is incident at a perpendicular angle to the upper surface 722 of the embossed structure 718 and irradiates the embossed structure 718 and the optical material layer 706. Infrared radiation beams 728 will heat the starting optical material 706 through the exposed portion 714 of the lower surface 710 of the starting optical material layer 706.

The electron beam 726 fully penetrates the embossed structure 718 and partially penetrates the starting optical material layer 706 between the between the upper surface 708 and the lower surface 710 of the optical material layer.

Figure 12C:
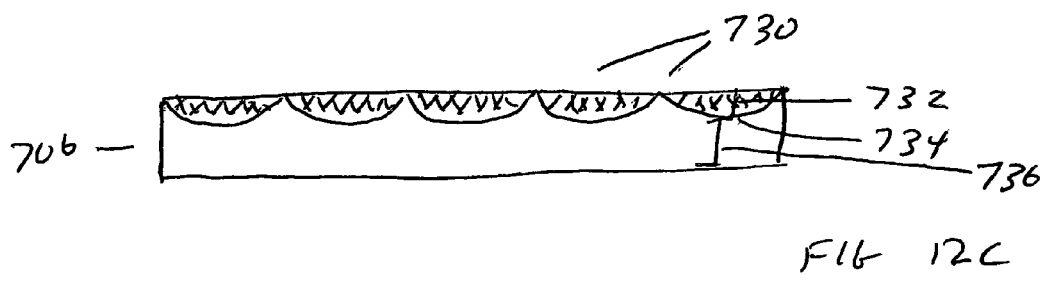

As shown in FIG. 12C, the embossing structure 718 of photoresist is removed by conventional means. The optical material layer 706 is removed from the substrate support rings 700 by conventional chemical, etching, physical means or the use of a release layer, as discussed previously.

The partial penetration of the electron beam irradiation forms semi-circular concave areas 730 having a varying thickness 732 from the upper surface 708 extending into the optical material 706. These areas 730 will have an index of refraction of either $n_2$ to $n_1$ or $n_1$, which is higher than the original index of refraction $n_0$ of the starting optical material layer 706. The lower surface 734 of the areas is at the irradiation penetration depth of the electron beam through the embossing structure and into the optical material layer. The varying thickness of the areas is in inverse proportion to the upper surface of the embossed structure.

The surrounding optical material sub-layer 706, which was not irradiated by the electron beam, has the original index of refraction $n_0$ of the starting optical material layer. The lower sub-layer will have a thickness 736 equivalent to the original thickness 716 of the starting optical material less the thickness 732 of the areas 730.

Since the starting optical material layer is one layer, after electron beam irradiation, the areas 730 of high refractive index are integral and positioned adjacent to the surrounding optical material sub-layer 706 within the optical material layer.

The areas 730 of high refractive index form a microlens structure in the optical material layer 706. The microlens structure is in inverse image of the embossing structure.

The optical material layer with a lower refractive index will have a microlens structure with a high refractive index without fabrication by deposition, without an intervening adhesive layer between the structure and layer, and with both structure and layer being formed from the same optical material.

The depth of the penetrating electron beam and the resulting thickness of the altered refractive index layer are determined by the dose, voltage and duration of the electron beam and accordingly can vary from the upper surface of the starting optical material layer to the lower surface of the microlens structure.

The electron beam can provide a uniform refractive index $n_1$ to the resulting irradiated optical material of the microlens structure, as discussed in FIG. 8, to form a binary diffractive lens. Or the electron beam can provide a gradient refractive index $n_2$ to $n_1$ to the resulting irradiated optical material of the microlens structure, as discussed in FIG. 11, to form a gradient index (GRIN) lens. The gradient refractive index lens will have a refractive index which varies from $n_1$ to $n_2$ by depth, with the upper refractive index $n_2$ closer to the upper surface of the optical material being higher than the lower refractive index $n_1$ closer to the lower surface of the optical material. Both refractive indexes $n_1$ to $n_2$ are higher than the original index of refraction $n_0$, of the starting optical material layer. The GRIN array and the optical material layer can be lifted off the substrate by dissolving the release layer.

Figure 13A:
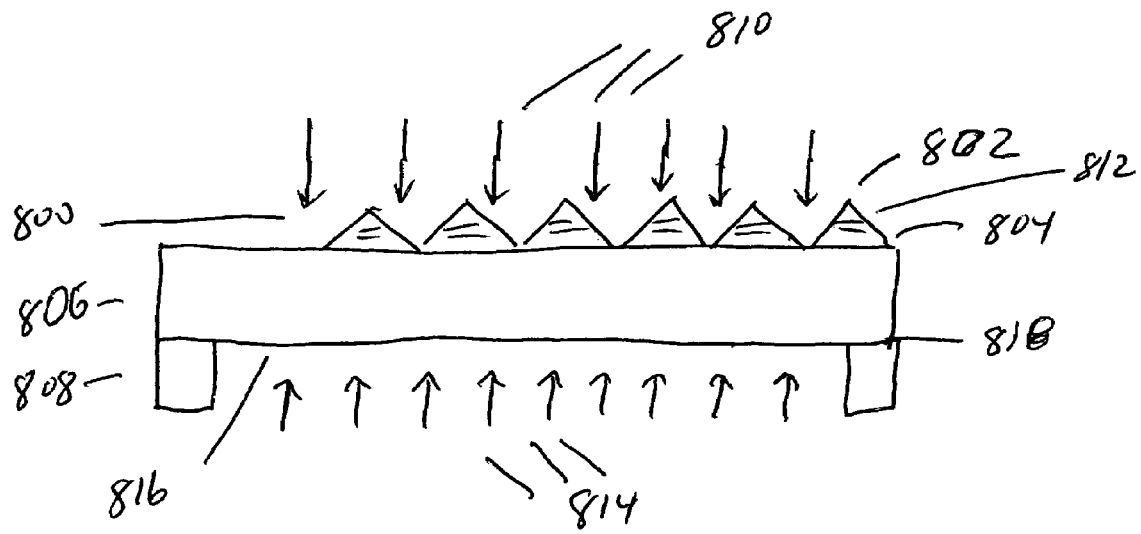
FIG. 13 shows in FIGS. 13A and 13B schematic views of generating gradients with supported films using embossed masks.

As shown in an alternate embossed structure embodiment of FIG. 13A, a wax embossed structure 800 of 120 degree included angle prisms 802 at a regular pitch interval is deposited on the upper surface 804 of the starting optical material 806. The starting optical material 806 is positioned on a substrate support ring 808. The electron beam apparatus and method are the same as in FIG. 9.

A large area electron beam 810 is incident at a perpendicular angle to the upper surface 812 of the embossed structure 800 and irradiates the embossed structure 800 and the optical material layer 806. Infrared radiation beams 814 will heat the starting optical material 806 through the exposed portion 816 of the lower surface 818 of the starting optical material layer 806.

The electron beam 810 fully penetrates the embossed structure 800 and partially penetrates the starting optical material layer 806 between the between the upper surface 804 and the lower surface 818 of the optical material layer.

Figure 13B:
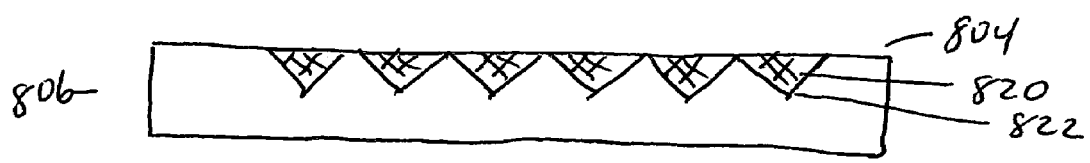

As shown in FIG. 13B, the embossing structure 800 of wax is removed by conventional means. The optical material layer 806 is removed from the substrate support rings 808 by conventional chemical, etching, physical means or the use of a release layer, as discussed previously.

The partial penetration of the electron beam irradiation forms a refractive index gradient patterned area 820, triangular in cross-section, from the upper surface 804 extending into the optical material 806. These triangular areas 820 will have a varying refractive index from $n_1$ to $n_2$ by depth, with the upper refractive index $n_2$ closer to the upper surface 804 being higher than the lower refractive index $n_1$ closer to the lower surface 818. Both refractive indexes $n_1$ to $n_2$ are higher than the original index of refraction $n_0$. The lower surface 822 of the triangular areas is at the irradiation penetration depth of the electron beam through the embossing structure and into the optical material layer. The varying thickness of the areas is in inverse proportion to the upper surface 812 of the embossed structure. The index gradient is in inverse image of the embossing structure.

The surrounding optical material sub-layer 806, which was not irradiated by the electron beam, has the original index of refraction $n_0$ of the starting optical material layer.

Since the starting optical material layer is one layer, after electron beam irradiation, the areas 820 of high refractive index are integral and positioned adjacent to the surrounding optical material sub-layer 806 within the optical material layer.

The index gradient 820 can be used as a diffraction grating or a beam-splitter. Light propagating within the alternating sections of low and varying high refractive index in the resulting optical material layer will be extracted by the index gradient.

The electron beam can provide a uniform refractive index $n_1$ to the resulting irradiated optical material of the index gradient structure, as discussed in FIG. 11, to form a refractive lens.

An aperture mask can be used with the electron beam apparatus and method to provide a section of one refractive index integral and adjacent to a section of another refractive index with both sections formed of the same optical material.

Figure 14A:
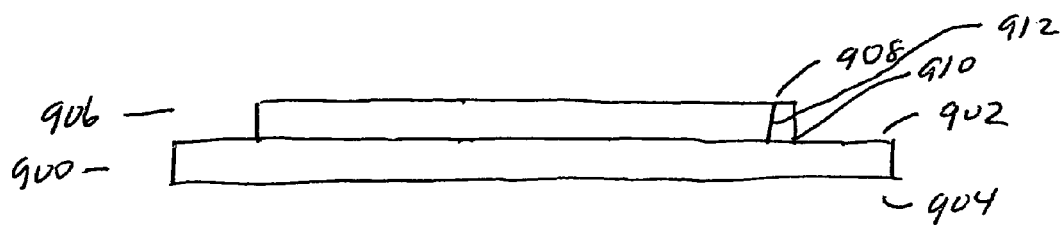
FIG. 14 shows in FIGS. 14A, 14B, and 14C schematic views of forming a diffraction grating.

As shown in FIG. 14A, the substrate 900 has an upper surface 902 and a lower surface 904. The starting optical material layer 906 has an upper surface 908 and a lower surface 910. The lower surface 910 of the starting optical material layer is deposited, bonded, coated, or otherwise positioned on the upper surface 902 of the substrate. The starting optical material layer 906 will have an original index of refraction $n_0$ and a thickness 912.

Figure 14B:
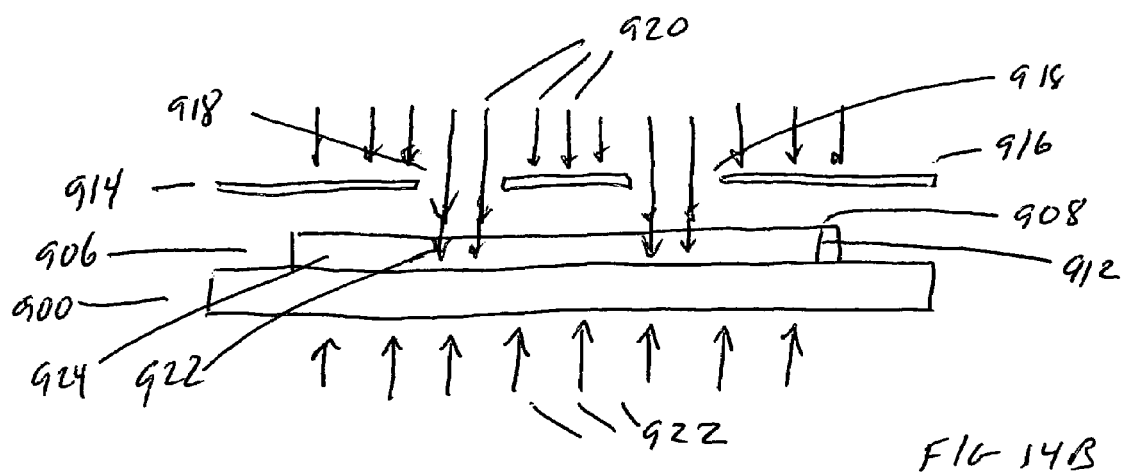

As shown in FIG. 14B, an aperture mask 914 is positioned between the electron beam source (not shown in this Figure) and the starting optical material layer 906. The mask 914 has an upper surface 916 and apertures 918.

A large area electron beam 920 is incident at a perpendicular angle to the upper surface 908 of the optical material layer 906 through the apertures 918 of the mask 914 and irradiates the optical material layer through the mask apertures 918. The electron beam 920 will be absorbed, or otherwise blocked, by the surface 916 of the mask 914 but will be transmitted through the apertures 918. Infrared radiation beams 922 will heat the substrate 900 through the lower surface 904 and, by heat transfer through the substrate, will heat the starting optical material 906.

The electron beam 920 fully penetrates the depth or thickness 912 of the optical material layer 906 to the lower surface 910 of the optical material layer 906 and the upper surface 902 of the substrate 900 in the first sections 922 of the optical material layer 906 exposed to the electron beam through the apertures 918. Second sections 924 of the optical material layer 906 was not exposed to the electron beam 920 because the mask 914 absorbed or blocked the electron beam.

Figure 14C:

As shown in FIG. 14C, the aperture mask 914 is removed. The optical material layer 906 is removed from the substrate 900 by conventional chemical, etching, physical means or the use of a release layer, as discussed previously.

After heating and electron beam irradiation through the mask aperture, the first section 922 of the optical material layer 906 will have an index of refraction $n_1$, which is higher than the original index of refraction $n_0$ of the starting optical material layer, through the full thickness 912 of the optical material layer. The second section 924 of the optical material layer 906, which was not exposed to the electron beam irradiation, will have the original index of refraction $n_0$ of the starting optical material layer. Since the starting optical material layer is one layer, after electron beam irradiation, the first section is integral and positioned adjacent to the second section within the optical material layer.

The mask serves to restrict the electron beam spatially limiting its irradiation to the apertured sections of the optical material layer.

The optical material layer will have adjacent sections of different refractive indexes but formed from the same optical material and can be used as a diffraction grating or interference filter.

The optical material layer will have adjacent sections of different refractive indexes without fabrication by deposition, without an intervening adhesive layer between the structure and layer or between adjacent sections, and with both adjacent sections being formed from the same optical material.

The depth of the penetrating electron beam and the resulting thickness of the altered refractive index layer are determined by the dose, voltage and duration of the electron beam and accordingly can vary from the upper surface of the starting optical material layer to the lower surface of the microlens structure.

The electron beam can provide a uniform refractive index $n_1$ to the resulting irradiated optical material with adjacent sections of different refractive indexes, as discussed in FIG. 8, to form a refractive lens. Or the electron beam can provide a gradient refractive index $n_2$ to $n_1$ to the resulting irradiated optical material adjacent sections of different refractive indexes, as discussed in FIG. 11, to form a gradient index (GRIN) lens.

Multiple masking steps can provide multiple sections with multiple different refractive indexes in the same optical material layer formed from the same optical material. The multiple sectioned optical material layer with multiple different refractive indexes can be used as a fresnel lens.

The electron beam can be incident at an angle to the aperture mask and the surface of the starting optical material layer to form a tilted refractive index gradient.

Figure 15A:
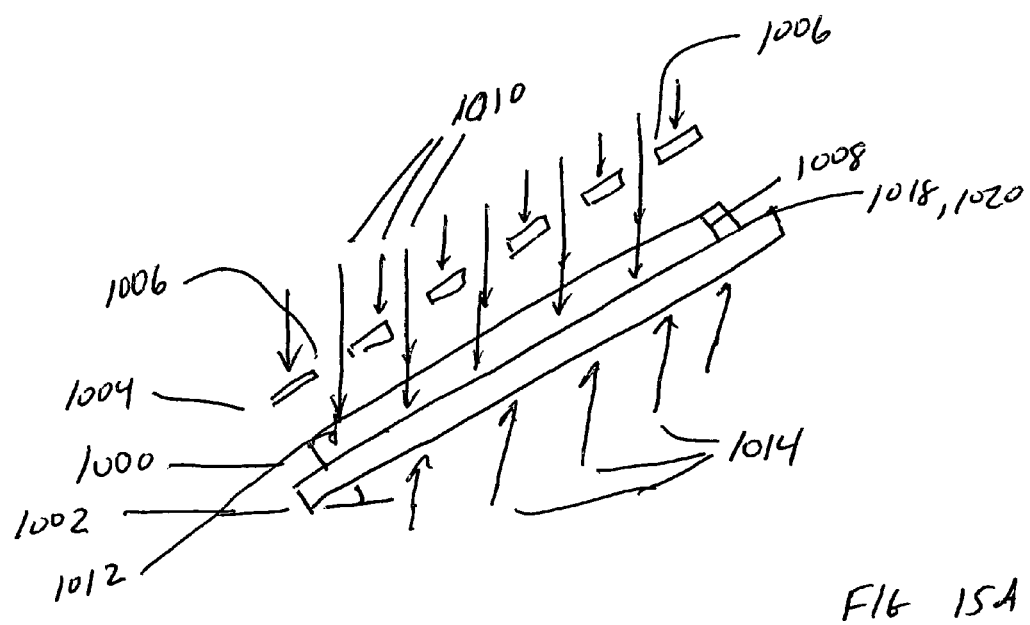
FIG. 15 shows in FIGS. 15A and 15B schematic views of off axis exposures and the resulting optical structures.

As shown in the alternate embodiment of FIG. 15A, the starting optical material layer 1000 is positioned on the substrate layer 1002. The electron beam apparatus and method of FIG. 15 are the same as in FIG. 14.

A mask 1004 with multiple apertures 1006 is positioned between the electron beam source (not shown in this Figure) and the starting optical material layer 1000. The starting optical material layer 1006 will have an original index of refraction $n_0$ and a thickness 1008. The mask, starting optical material layer and substrate are all parallel.

A large area electron beam 1010 is incident at a 15 degree angle to the mask 1004 and starting optical material 1000. The electron beam irradiates the exposed angled sections 1012 of the starting optical material layer through the apertures 1006 of the mask 1004. The electron beam 1010 will be absorbed, or otherwise blocked, by the mask 1004 but will be transmitted through the apertures 1006. Infrared radiation beams 1014 will heat the substrate 1002 and, by heat transfer through the substrate, will heat the starting optical material 1000.

Figure 15B:
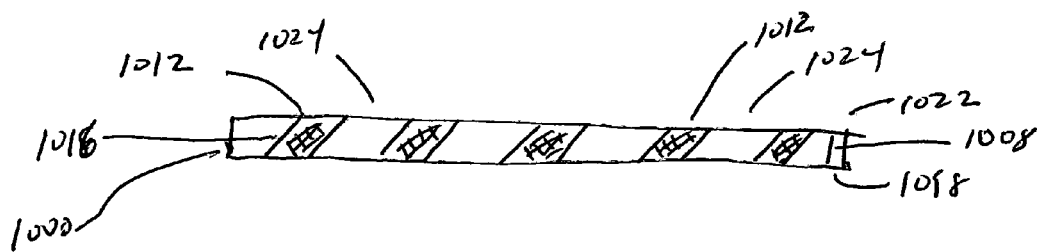

As shown in FIGS. 15A and 15B, the electron beam 1010 fully penetrates the cross-sectional depth or thickness 1016 of the optical material layer 1000 to the lower surface 1018 of the optical material layer 1000 and the upper surface 1020 of the substrate 1002 in the first exposed sections 1012 of the optical material layer 1000 through the apertures 1006.

The exposed sections will have a varying gradient index of refraction from $n_1$ to $n_2$ by depth, with the upper refractive index $n_2$ closer to the upper surface 1022 being higher than the lower refractive index $n_1$ closer to the lower surface 1018 through the full thickness 1008 of the optical material layer 1000. Both refractive indexes $n_1$ to $n_2$ are higher than the original index of refraction $n_0$ in the alternating section.

The second section 1024 of the optical material layer 100, which was not exposed to the electron beam irradiation due to the blocking or absorbing by the mask 1004, will have the original index of refraction $n_0$ of the starting optical material layer.

As shown in FIG. 15B, the aperture mask 1004 is removed. The optical material layer 1000 is removed from the substrate 1002 by conventional chemical, etching, physical means or the use of a release layer, as discussed previously.

The alternating first sections 1012 of high refractive index and the second sections 1024 of low refractive index are parallel to each other but are at a 15 degree angle to the upper surface 1022 and lower surface 1018 of the optical material layer 1000 and will form a tilted refractive index gradient layer 1000. Since the starting optical material layer is one layer, after electron beam irradiation, the first section is integral and positioned adjacent to the second section within the optical material layer.

The tilted index gradient can be used as an output coupling device, a diffraction grating or a beam-splitter. Light propagating within the alternating sections of low and varying high refractive index in the resulting optical material layer will be extracted by the tilted gradient.

The mask serves to restrict the electron beam spatially limiting its irradiation to the apertured sections of the optical material layer.

The depth of the penetrating electron beam and the resulting thickness of the altered refractive index layer are determined by the dose, voltage and duration of the electron beam and accordingly can vary from the upper surface of the starting optical material layer to the lower surface of the gradient index structure.

The electron beam can provide a uniform refractive index $n_1$ to the resulting irradiated optical material with adjacent sections of different refractive indexes, as discussed in FIG. 8, to form a diffraction grating or beam-splitter.

Multiple masking steps can provide multiple sections for the tilted index gradient with multiple different refractive indexes in the same optical material layer formed from the same optical material.

The electron beam with multiple masking steps can form a binary diffractive optical element of the same optical material.

Figure 16A:
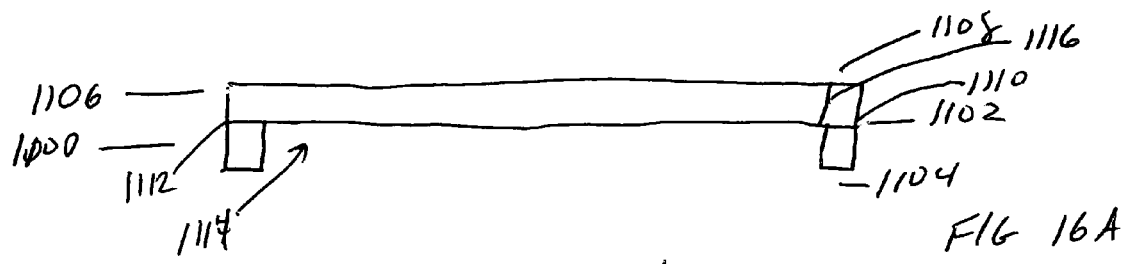
FIG. 16 shows in FIGS. 16A, 16B, 16C, 16D and 16E schematic views of sequential exposures creating binary diffractive optical element structures.

As shown in FIG. 16A, the substrate 1100 is a support ring with an upper surface 1102 and a lower surface 1104. The starting optical material layer 1106 has an upper surface 1108 and a lower surface 1110.

A small portion 1112 of the lower surface 1110 of the starting optical material layer is deposited, bonded, coated, or otherwise positioned on the upper surface 1102 of the substrate support ring. A large portion 1114 of the lower surface 1110 of the starting optical material layer remains exposed.

The starting optical material layer 1106 will have an original index of refraction $n_0$ and a first or full thickness 1116.

Figure 16B:
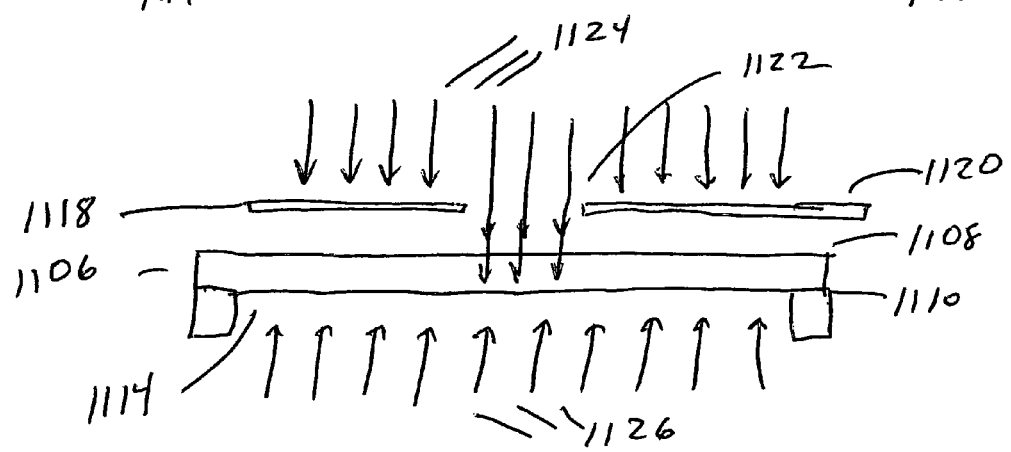

As shown in FIG. 16B, a first aperture mask 1118 is positioned between the electron beam source (not shown in this Figure) and the starting optical material layer 1106. The first mask 1118 has an upper surface 1120 and a single first aperture 1122.

A first large area electron beam 1124 is incident at a perpendicular angle to the upper surface 1108 of the optical material layer 1106 through the first aperture 1122 of the first mask 1118 and irradiates the optical material layer through the first mask aperture 1122. The first electron beam 1124 will be absorbed, or otherwise blocked, by the surface 1120 of the first mask 1118 but will be transmitted through the first mask aperture 1122. First infrared radiation beams 1126 will heat the exposed portion 1114 of the lower surface 1110 of the starting optical material 1106.

Figure 16C:
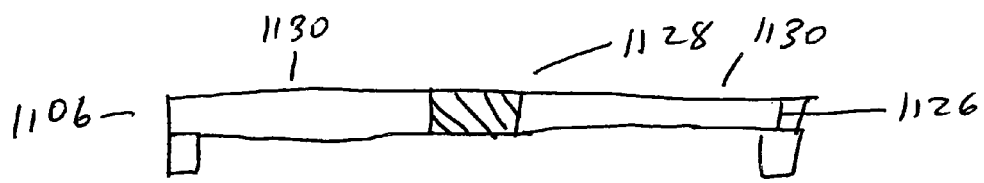

As shown in FIG. 16C, the first electron beam 1124 fully penetrates the first depth or thickness 1126 of the optical material layer 1106 to the lower surface 1110 of the optical material layer 1106 in a first section 1128 of the optical material layer 1106.

The remaining section 1130 of the optical material layer 1106 was not exposed to the electron beam 1124 because the mask 1118 absorbed or blocked the electron beam.

The first section 1128 of the optical material layer 1106 will have an index of refraction $n_1$, which is higher than the original index of refraction $n_0$ of the starting optical material layer, through the full first thickness 1116 of the optical material layer. The remaining section 1130 of the optical material layer 1106, which was not exposed to the electron beam irradiation, will have the original index of refraction $n_0$ of the starting optical material layer.

The first aperture mask 1118 is removed.

Figure 16D:
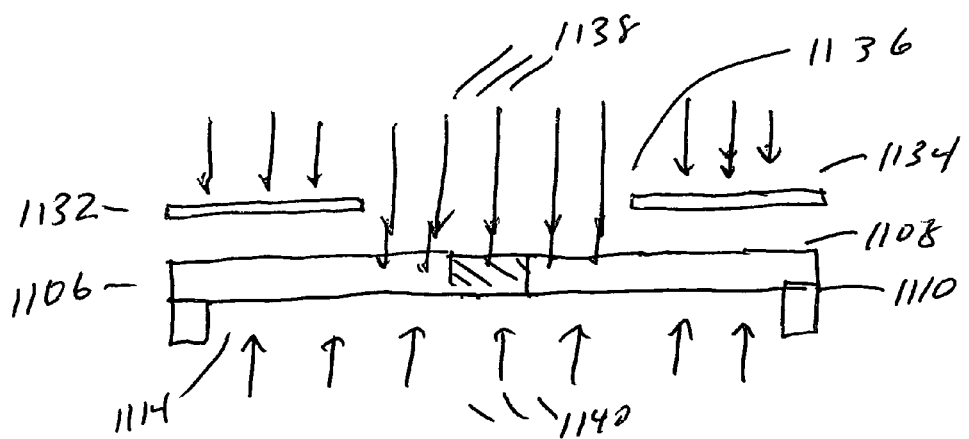

As shown in FIG. 16D, a second aperture mask 1132 is positioned between the electron beam source (not shown in this Figure) and the optical material layer 1106. The second mask 1132 has an upper surface 1134 and a single second aperture 1136. The second aperture 1136 in the second aperture mask is wider than the first aperture 122 in the first aperture mask.

A second large area electron beam 1138 is incident at a perpendicular angle to the upper surface 1108 of the optical material layer 1106 through the second aperture 1136 of the second mask 1132 and irradiates the optical material layer through the second mask aperture 1136. The second electron beam 1138 will be absorbed, or otherwise blocked, by the surface 1134 of the second mask 1132 but will be transmitted through the second mask aperture 1136. Second infrared radiation beams 1140 will heat the exposed portion 1114 of the lower surface 1110 of the starting optical material 1106.

Figure 16E:
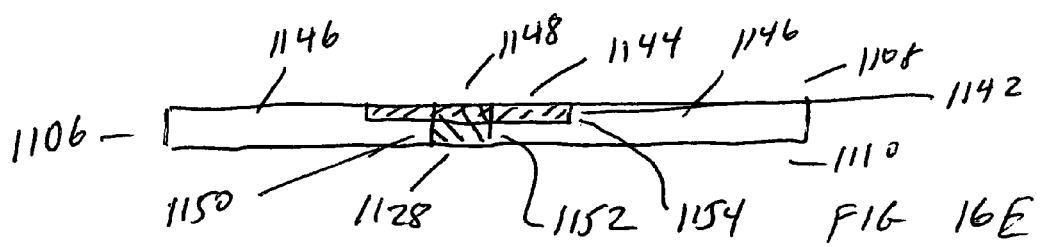

As shown in FIG. 16E, the second aperture mask 1132 is removed. The optical material layer 1106 is removed from the substrate 1100 by conventional chemical, etching, physical means or the use of a release layer, as discussed previously.

The second electron beam 1138 partially penetrates to a second depth or thickness 1142 of the optical material layer 1106 between the upper surface 1108 and the lower surface 1110 of the optical material layer 1106 in a second section 1144 of the optical material layer 1106. The remaining section 1146 of the optical material layer 1106 was not exposed to the electron beam 1138 because the mask 1132 absorbed or blocked the electron beam.

The second section 1144 of the optical material layer 1106 will have an index of refraction $n_2$, which is higher than the original index of refraction $n_0$ of the starting optical material layer. The remaining section 1146 of the optical material layer 1106, which was not exposed to the electron beam irradiation, will have the original index of refraction $n_0$ of the starting optical material layer.

The second section 1144 of high refractive index is wider than the first section 1128 of high refractive index. The second section 1144 of high refractive index has a shallower depth than the first section 1128 of high refractive index. The second section 1144 of high refractive index overlaps in one area 1148 the first section 1128 of high refractive index. The overlap area 1148 will have an index of refraction $n_3$, which is higher than the original index of refraction $n_0$ of the starting optical material layer 1006.

The two beam exposure through two different size apertures forms a binary diffractive optical element 1150. The binary diffractive optical element 1150 is a two level diffractive element structure. The binary diffractive optical element has a first level 1152 of the first section 1128 of high refractive index and a second level 1154 of the second section 1144 of high refractive index including the overlap area 1148 of high refractive index within the remaining section 1146 of low refractive index of the optical material layer 1106.

Multiple masks and multiple electron beam exposure of the starting optical material will provide multiple refractive index sections for a multiple level diffractive structure for the binary diffractive optical element optical element. The binary or multiple level diffractive optical element can be used as a diffraction grating or a beam-splitter.

An aperture mask can be used with the electron beam apparatus and method to provide a waveguide having a core of a high refractive index surrounded or partially surrounded by a cladding layer of a low refractive index of the same optical material.

Figure 17A:
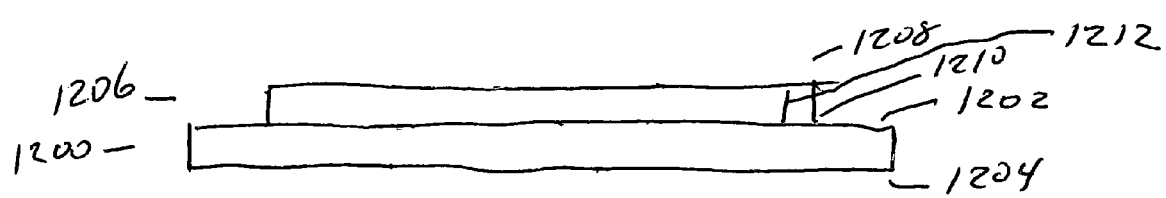
FIG. 17 shows in FIGS. 17A, 17B, 17C and 17D schematic views of forming a waveguide.

As shown in FIG. 17A, the substrate 1200 has an upper surface 1202 and a lower surface 1204. The starting optical material layer 1206 has an upper surface 1208 and a lower surface 1210. The lower surface 1210 of the starting optical material layer is deposited, bonded, coated, or otherwise positioned on the upper surface 1202 of the substrate. The starting optical material layer 1206 will have an original index of refraction $n_0$ and a thickness 1212.

Figure 17B:
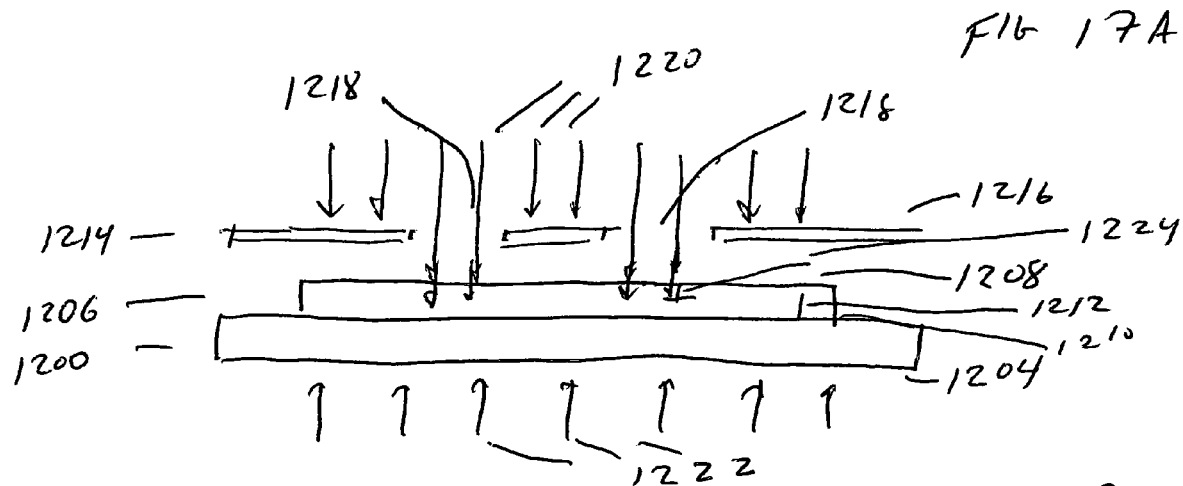

As shown in FIG. 17B, an aperture mask 1214 is positioned between the electron beam source (not shown in this Figure) and the starting optical material layer 1206. The mask 1214 has an upper surface 1216 and multiple apertures 1218.

A large area electron beam 1220 is incident at a perpendicular angle to the upper surface 1208 of the optical material layer 1206 through the apertures 1218 of the mask 1214 and irradiates the optical material layer through the mask apertures 1218. The electron beam 1220 will be absorbed, or otherwise blocked, by the surface 1216 of the mask 1214 but will be transmitted through the apertures 1218. Infrared radiation beams 1222 will heat the substrate 1200 through the lower surface 1204 and, by heat transfer through the substrate, will heat the starting optical material 1206.

Figure 17C:
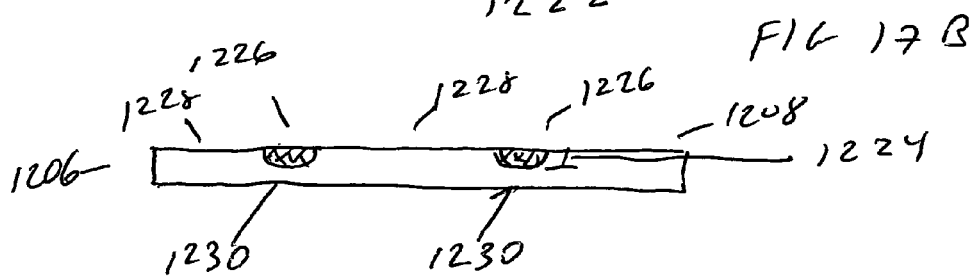

As shown in FIGS. 17B and 17C, the electron beam 1220 partially penetrates the depth or thickness 1212 of the optical material layer 1206 to a depth or thickness 1224 between the upper surface 1208 and the lower surface 1210 of the optical material 1206 in the first sections 1226 exposed to the electron beam through the aperture 1218. Another second sections 1228 of the optical material layer 1206 were not exposed to the electron beam 1220 because the mask 1214 absorbed or blocked the electron beam.

As shown in FIG. 17C, the aperture mask 1214 is removed. The optical material layer 1206 is removed from the substrate 1200 by conventional chemical, etching, physical means or the use of a release layer, as discussed previously.

After heating and electron beam irradiation through the mask aperture, the first sections 1226 of the optical material layer 1206 will have an radial gradient index of refraction $n_2$ to $n_1$, which is higher than the original index of refraction $n_0$ of the starting optical material layer, through the thickness 1224 of the optical material layer. The second sections 1228 of the optical material layer 1206, which were not exposed to the electron beam irradiation, will have the original index of refraction $n_0$ of the starting optical material layer. Since the starting optical material layer is one layer, after electron beam irradiation, the first sections are integral and positioned adjacent to the second sections within the optical material layer.

The first sections 1226 of high refractive index form a waveguide core layer in the surrounding second sections 1228 of low refractive index starting optical material layer which functions as a waveguide cladding layer. The waveguide 1230 extends from the surface 1208 of the optical material layer 1206 with its core layer 1226 partially surrounded by the cladding layer 1228.

Figure 17D:
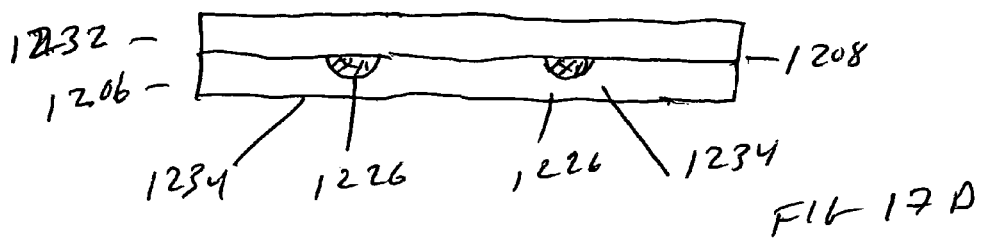

As shown in FIG. 17D, a second layer 1232 of starting optical material can be deposited, bonded, coated, or otherwise positioned on the upper surface 1208 on the core layer 1226 and the first starting optical material 1206 to completely surround the high refractive index core layer with a low refractive index cladding layer to form the waveguide 1234.

The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a uniform index of refraction for the core layer of the waveguide.

Figure 18A:
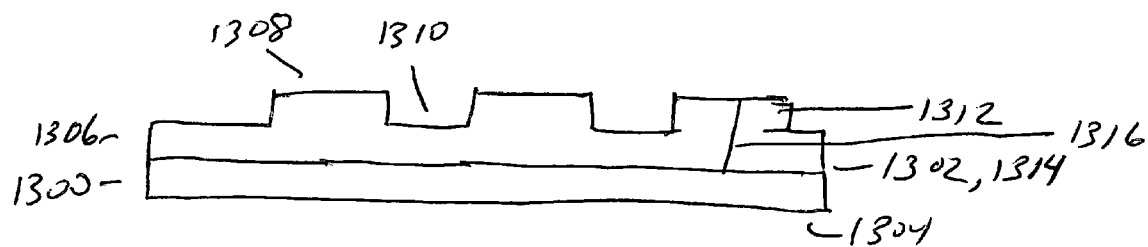
FIG. 18 shows in FIGS. 18A, 18B, 18C and 18D schematic views of forming waveguides from the patterned surface of the optical materials.

As shown in FIG. 18A, the substrate 1300 has an upper surface 1302 and a lower surface 1304. The starting optical material layer 1306 has a stepped pattern upper surface with alternating high upper surfaces 1308 and low upper surfaces 1310 across the width of the starting optical material layer. The flat surfaces 1308 and 1310 are offset from each other by a first depth 1312. The starting optical material layer 1306 has a flat lower surface 1314. The lower surface 1314 of the starting optical material layer is deposited, bonded, coated, or otherwise positioned on the upper surface 1302 of the substrate. The starting optical material layer 1306 will have an original index of refraction $n_0$ and a thickness 1316.

Figure 18B:
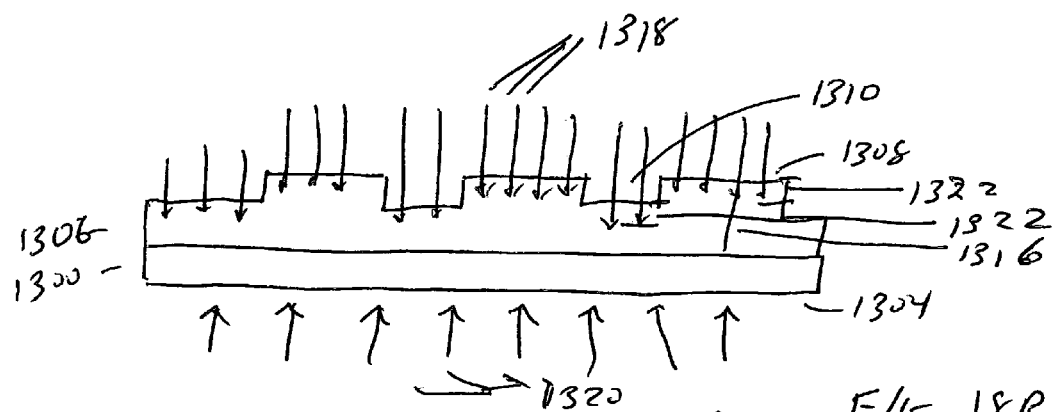

As shown in FIG. 18B, a first large area electron beam 1318 is incident at a perpendicular angle to the upper surfaces 1308 and 1310 of the optical material layer 1306 and irradiates the optical material layer. Infrared radiation beams 1320 will heat the substrate 1300 through the lower surface 1304 and, by heat transfer through the substrate, will heat the starting optical material 1306.

The electron beam 1318 partially penetrates the optical material layer to a second depth or thickness 1322 from the upper surfaces 1308 and 1310 into the optical material layer 1306. The penetration depth 1322 is less than the thickness 1316 of the optical material layer.

Figure 18C:
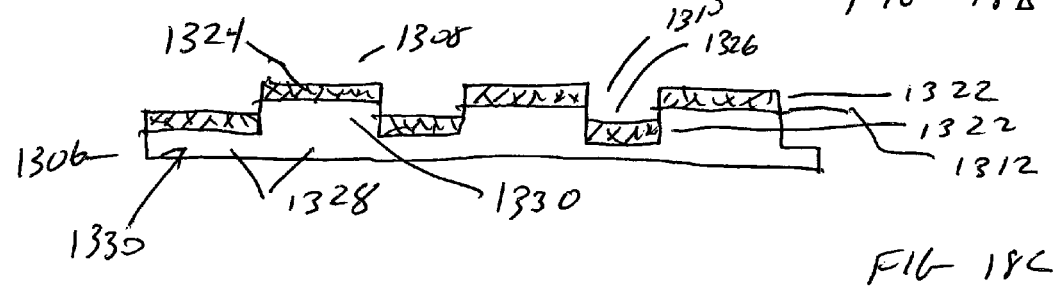

As shown in FIG. 18C, the optical material layer 1306 is removed from the substrate 1300 by conventional chemical, etching, physical means or the use of a release layer, as discussed previously.

The electron beam irradiation and heating forms first sections 1324 of refractive index change extending from the high upper surfaces 1308 into the optical material layer 1306 to a depth 1322 and second sections 1326 of refractive index change extending from the low upper surfaces 1310 into the optical material layer 1306 to a depth 1322. The first sections 1324 and second sections 1326 are identical except for the relative difference in first depth 1312 into the optical material 1306. The first and second sections 1324 and 1326 of refractive index change each have an index of refraction have an radial gradient index of refraction $n_2$ to $n_1$, which is higher than the original index of refraction $n_0$ of the starting optical material layer, through the thickness 1322 of the optical material layer 1306.

A third section 1328 of the optical material layer 1306 which were not exposed to the electron beam irradiation, will have the original index of refraction $n_0$ of the starting optical material layer.

Since the starting optical material layer is one layer, after electron beam irradiation, the first section is integral and positioned adjacent to the third section within the optical material layer and the second section is integral and positioned adjacent to the third section within the optical material layer.

The first sections 1324 of high refractive index form a waveguide core layer in the surrounding third section 1328 of low refractive index starting optical material layer which functions as a waveguide cladding layer. The waveguide 1330 extends from the surface 1308 of the optical material layer 1306 with its core layer 1324 partially surrounded by the cladding layer 1328.

The second sections 1326 of high refractive index form a waveguide core layer in the surrounding third section 1328 of low refractive index starting optical material layer which functions as a waveguide cladding layer. The waveguide 1330 extends from the surface 1308 of the optical material layer 1306 with its core layer 1326 partially surrounded by the cladding layer 1328.

Figure 18D:
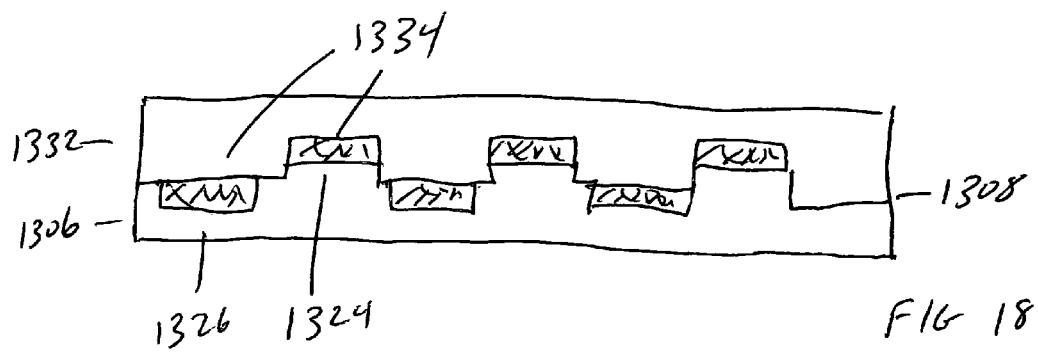

As shown in FIG. 18D, a second layer 1332 of starting optical material can be deposited, bonded, coated, or otherwise positioned on the upper surface 1308 on the core layers 1324 and 1326 and the first starting optical material 1306 to completely surround the high refractive index core layer with a low refractive index cladding layer to form the waveguides 1334.

The variable depths of the upper surface allow for precise positioning of the core layer of the waveguide in the cladding layer. The variable spacing between the waveguides allows for precise positioning relative to each other.

The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a uniform index of refraction for the core layer of the waveguide.

Figure 19A:
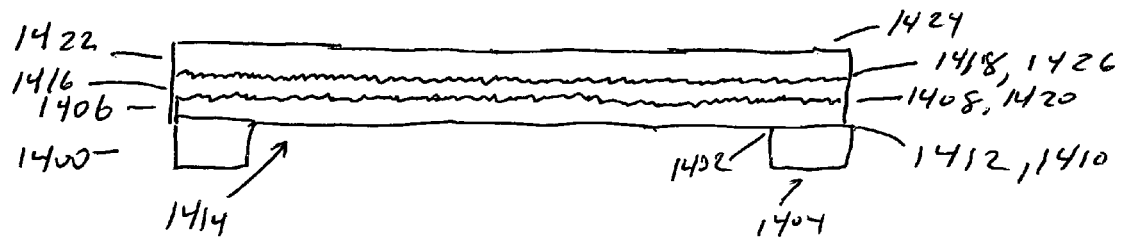
FIG. 19 shows in FIGS. 19A, 19B and 19C schematic views of forming an embedded waveguide with blazed surface diffraction gratings.

As shown in FIG. 19A, the substrate 1400 is a support ring with an upper surface 1402 and a lower surface 1404. A first optical material layer 1406 has an upper blazed surface 1408 and a lower surface 1410. A small portion 1412 of the lower surface 1410 of the starting optical material layer is deposited, bonded, coated, or otherwise positioned on the upper surface 1402 of the substrate support ring. A large portion 1414 of the lower surface 1410 of the starting optical material layer remains exposed.

A second optical material layer 1416 has a blazed upper surface 1418 and a blazed lower surface 1420. A third optical material layer 1422 has an upper surface 1424 and a blazed lower surface 1426.

The lower blazed surface 1420 of the second optical material layer 1416 is deposited, bonded, coated, or otherwise positioned on the upper blazed surface 1408 of the first optical material layer 1406. The lower blazed surface 1426 of the third optical material layer 1422 is deposited, bonded or otherwise positioned on the upper blazed surface 1418 of the second optical material layer 1416. The second optical material layer 1406 will have an original index of refraction $n_0$. The first and third optical material layers will be formed of different material than the second optical material layer but will also have an index of refraction of $n_0$.

Figure 19B:
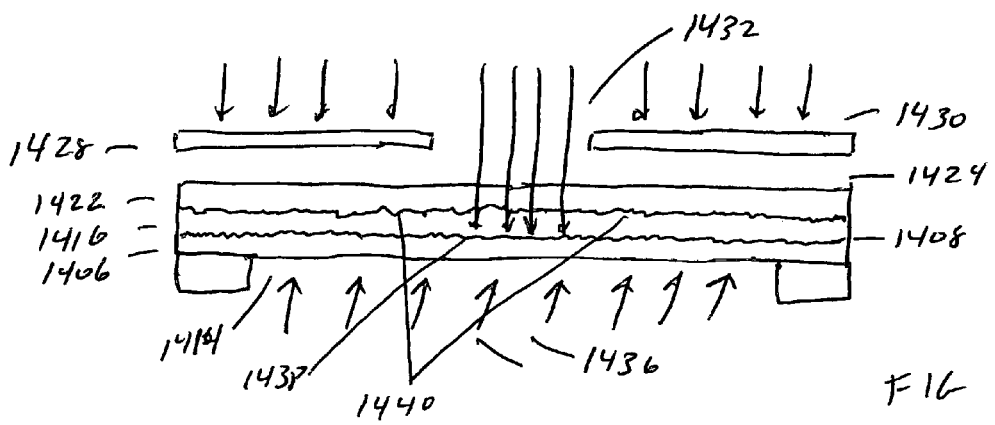

As shown in FIG. 19B, an aperture mask 1428 is positioned between the electron beam source (not shown in this Figure) and the third optical material layer 1422. The mask 1428 has an upper surface 1430 and a single aperture 1432.

A large area electron beam 1434 is incident at a perpendicular angle to the upper surface 1424 of the third optical material layer 1422 through the aperture 1432 of the mask 1428 and irradiates the third optical material layer 1422 and the underlying second optical material layer 1416 through the mask aperture 1432. The electron beam 1434 will be absorbed, or otherwise blocked, by the surface 1430 of the mask 1428 but will be transmitted through the aperture 1432. Infrared radiation beams 1436 will heat the first optical material layer 1406 through the exposed portion 1414 of the lower surface 1410 and, by heat transfer through the first optical material layer 1406, will heat the second optical material layer 1416.

The electron beam 1434 fully penetrates the third optical material layer 1422 and fully penetrates the second optical material layer 1416 to the upper surface 1408 of the first optical material layer 1406 in the first section 1438 of the second optical material layer 1426 exposed to the electron beam through the aperture 1432. A second section 1440 of the second optical material layer 1416 was not exposed to the electron beam 1434 because the mask 1428 absorbed or blocked the electron beam. The electron beam irradiation will not effect the third optical material layer 1422. The electron beam irradiation will effect the second optical material layer 1416, which is formed of a different optical material than the third and first optical material layers.

Figure 19C:
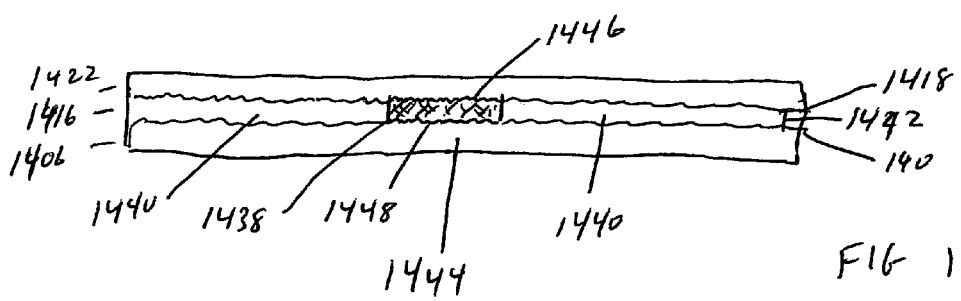

As shown in FIG. 19C, the substrate 1400 is removed from the first optical material layer 1406 by conventional chemical, etching, physical means or the use of a release layer, as discussed previously.

After heating and electron beam irradiation through the mask aperture, the first section 1438 of the second optical material layer 1416 will have a radial gradient index of refraction $n_2$ to $n_1$, which is higher than the original index of refraction $n_0$ of the second optical material layer 1416 and higher than the index of refraction $n_0$ of the first and third optical material layers 1406 and 1422, through the thickness 1442 of the second optical material layer 1416. The second section 1440 of the second optical material layer 1406, which was not exposed to the electron beam irradiation, will have the original index of refraction $n_0$ of the second optical material layer 1416.

The first section 1438 of high refractive index forms a waveguide core layer in the surrounding second optical material layer 1416, first optical material layer 1406 and third optical material layer 1422 of low refractive index which function as a waveguide cladding layer.

The waveguide 1444 extends from the upper surface grating 1446 from the upper blazed surface 1418 to the lower surface grating 1448 from the lower blazed surface 1420 with its core layer 1438 partially surrounded by the cladding layers 1416, 1406, and 1422.

The temperature of the substrates supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a uniform index of refraction for the core layer of the waveguide.

Figure 20A:
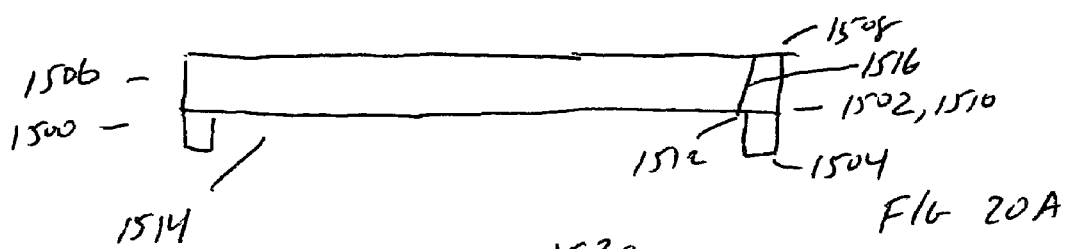
FIG. 20 shows in FIGS. 20A, 20B, 20C, and 20D schematic views of dual sided exposure techniques for forming a waveguide.

As shown in FIG. 20A, the substrate 1500 is a support ring with an upper surface 1502 and a lower surface 1504. The starting optical material layer 1506 has an upper surface 1508 and a lower surface 1510. A small portion 1512 of the lower surface 1510 of the starting optical material layer 1506 is deposited, bonded, coated, or otherwise positioned on the upper surface 1502 of the substrate support ring 1500. A large portion 1514 of the lower surface 1510 of the starting optical material layer 1506 remains exposed. The starting optical material layer 1506 will have an original index of refraction $n_0$ and a thickness 1516.

Figure 20B:
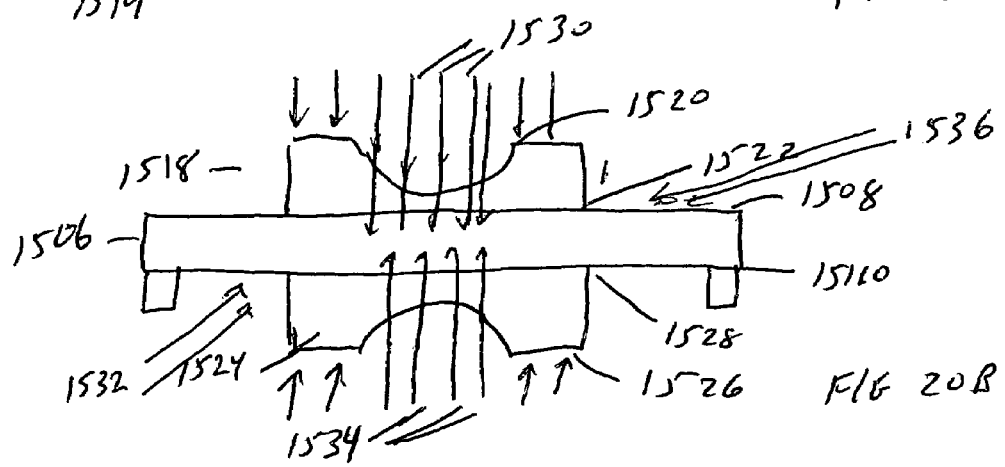

As shown in FIG. 20B, a first embossed wax structure 1518 has a concave curved upper surface 1520 and a flat lower surface 1522. The lower surface 1522 of the first embossed structure 1518 is deposited on the upper surface 1508 of the starting optical material layer 1506. A second embossed wax structure 1524 has a concave curved lower surface 1526 and a flat upper surface 1528. The upper surface 1528 of the second embossed structure 1524 is deposited on the lower surface 1510 of the starting optical material layer 1506. The first and second embossed wax structures are identical in shape and aligned in mirror image fashion on opposite surfaces of the starting optical material layer.

A first large area electron beam 1530 is incident at a perpendicular angle to the upper surface 1520 of the first embossed structure 1518 and irradiates the first embossed structure 1518 and the starting optical material layer 1506. Infrared radiation beams 1532 will heat the starting optical material 1506 from an angle to the lower surface 1510 of the starting optical material layer 1506.

The first electron beam 1530 fully penetrates the first embossed structure 1518 and partially penetrates the starting optical material layer 1506 through its upper surface 1508 between the upper surface 1508 and the lower surface 1510 of the optical material layer.

A second large area electron beam 1534 is incident at a perpendicular angle to the lower surface 1526 of the second embossed structure 1524 and irradiates the second embossed structure 1524 and the starting optical material layer 1506. Infrared radiation beams 1536 will heat the starting optical material 1506 from an angle to the upper surface 1508 of the starting optical material layer 1506.

The second electron beam 1534 fully penetrates the second embossed structure 1524 and partially penetrates the starting optical material layer 1506 through its lower surface 1510 between the lower surface 1510 and the upper surface 1508 of the optical material layer.

The first electron beam and the second electron beam can irradiate the starting optical material layer simultaneously.

Figure 20C:
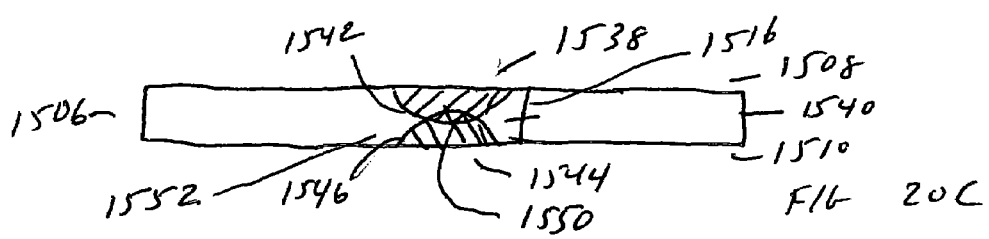

As shown in FIG. 20C, the first embossing structure 1518 and the second embossing structure 1524 are removed from the optical material layer 1506 by conventional means. The substrate 1500 is removed from the first optical material layer 1506 by conventional chemical, etching, physical means or the use of a release layer, as discussed previously.

The partial penetration of the first electron beam will form a first section 1538 in the optical material layer 1506 having a radial gradient index of refraction $n_2$ to $n_1$, which is higher than the original index of refraction $n_0$ of the optical material layer. The first section 1538 extends from the upper surface 1508 into the optical material layer 1506 past the midpoint 1540 of depth 1516 towards the lower surface 1510 in a semi-curved area 1542. The semi-curved area is in proportion to the electron beam irradiation through the curved surface of the embossed structure.

The partial penetration of the second electron beam will form a second section 1544 in the optical material layer 1506 having a radial gradient index of refraction $n_2$ to $n_1$, which is higher than the original index of refraction $n_0$ of the optical material layer. The first section extends from the lower surface 1510 into the optical material layer 1506 past the midpoint 1540 of depth 1516 towards the upper surface in a semi-curved area 1546. The semi-curved area is in proportion to the electron beam irradiation through the curved surface of the embossed structure.

A third section 1548 of the surrounding optical material layer 1506, which was not exposed to the electron beam irradiation, will have the original index of refraction $n_0$ of the starting optical material layer.

The first high refractive index section 1538 and second high refractive index section 1544 will overlap in an overlapping section 1550 in the optical material layer 1506. The overlap section 1550 will be exposed to irradiation from both the first and second electron beams. The overlap section will have a radial gradient index of refraction $n_4$ to $n_3$, which is higher than the radial gradient index of refraction $n_2$ to $n_1$ of the first and second sections 1538 and 1544 and higher than the original index of refraction $n_0$ of the optical material layer.

The high refractive index overlap section 1550 forms a waveguide core layer with the first section 1538, second section 1544 and third section 1548 of lower refractive indexes being the cladding layer of the waveguide surrounding the core layer.

The waveguide 1552 extends through the midpoint 1540 of the optical material layer 1506 completely surrounded by cladding layers 1538, 1544 and 1548.

Since the starting optical material layer is one layer, after electron beam irradiation, the first section is integral and positioned adjacent to the third section within the optical material layer, the second section is integral and positioned adjacent to the third section and the overlapping section is integral and positioned adjacent to the first section, second section and third section within the optical material layer.

Alternately, only one heating source will heat the starting optical material layer with infrared radiation beams 1532 from below the starting optical material layer or infrared radiation beams 1536 from above the starting optical material layer.

Also alternately, the formation of the waveguide can be a two step process with the first step being positioning the first embossing structure and the first electron beam irradiation from above the optical material layer and the second step of the positioning of the second embossing structure and the second electron beam irradiation from below the optical material layer.

Figure 20D:
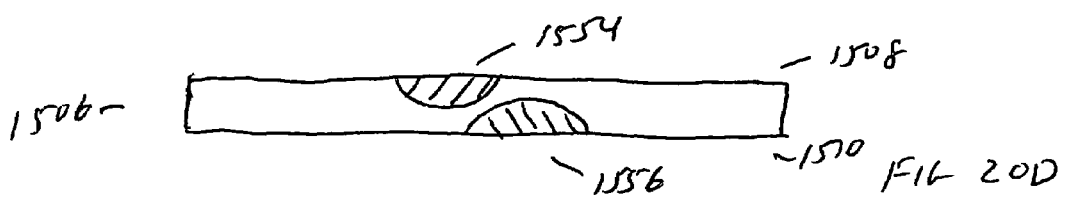

As shown in FIG. 20D, the first and second wax structures (not shown in this Figure) can be slightly out of alignment. The first section 1554 of high refractive index will form a first waveguide core layer on the upper surface 1508 with the partially surrounding starting optical material layer 1506 being the cladding layer of the first waveguide. The second section 1556 of high refractive index will form a second waveguide core layer on the lower surface 1510 with the partially surrounding starting optical material layer 1506 being the cladding layer of the second waveguide. In this instance, the first section 1554 of high refractive index and the second section 1556 of high refractive index do not overlap in the optical material layer 1506.

The embossed structures can be varied in the shape of the surfaces. The waveguides formed by the embossed structures cane be overlapping or isolated depending upon the alignment or nonalignment of the embossed structures on opposite surfaces of the optical material layer.

The temperature of the substrates supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a uniform index of refraction for the core layer of the waveguide.

Figure 21:
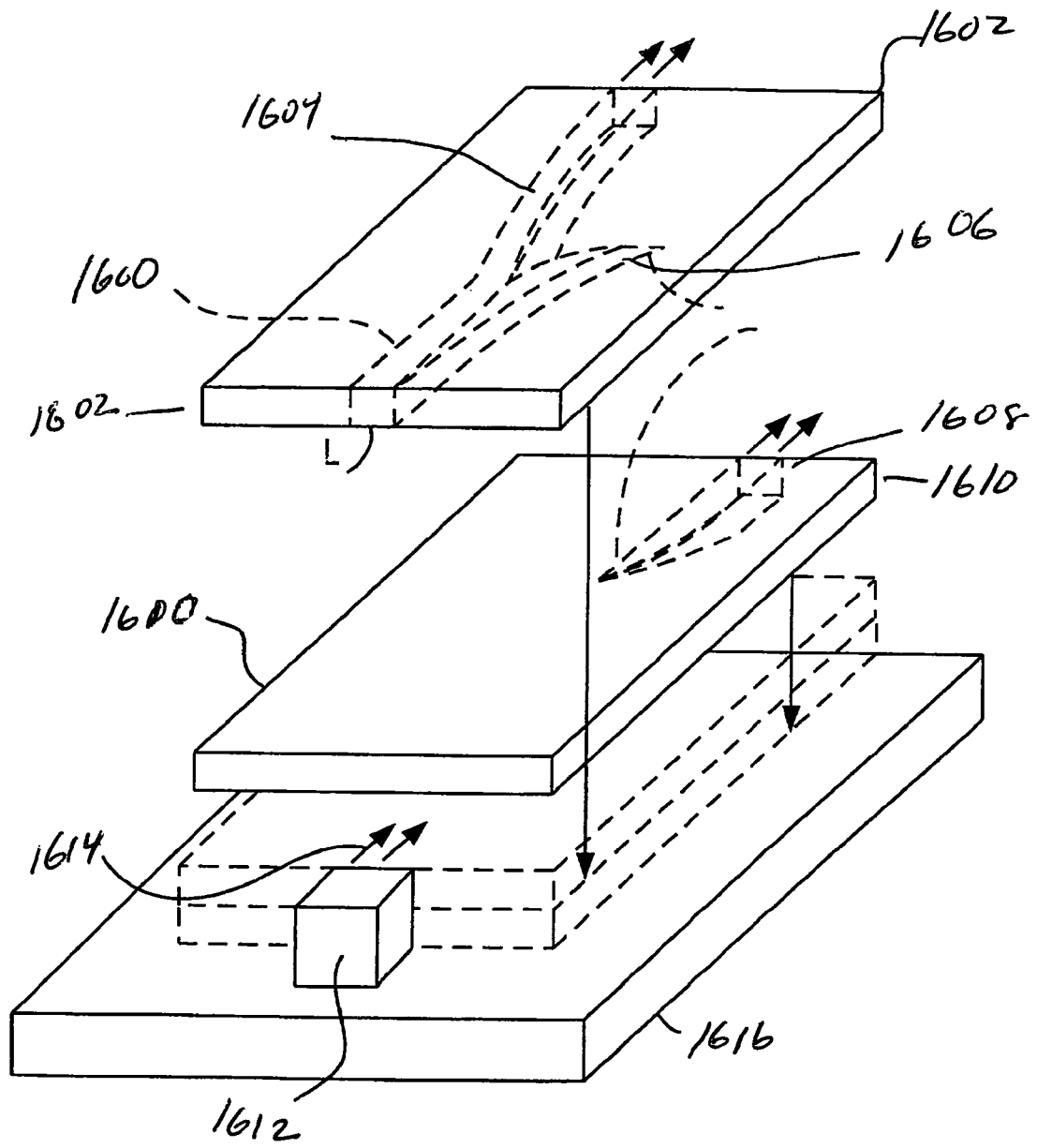
FIG. 21 shows an isometric view of representative multi-layered applications of the invention.

The use of masks in the electron beam apparatus and method allows the fabrication of optical interconnects in complex three dimensional optical elements by providing narrow waveguides and waveguides that can align between layers as shown in FIG. 21.

As shown in FIG. 21, a first waveguide 1600 in the upper layer 1602 is patterned to divide into a first branch waveguide 1604 and a second branch waveguide 1606. The first branch waveguide 1604 continues on in the upper layer 1602. The second branch waveguide 1606 interconnects in a mating pattern to a second waveguide 1608 in the lower layer 1610.

A laser diode 1612 is mounted such that an emitted light beam 1614 is coupled into the upper top layer 1602 while the lower bottom layer 1610 acts as a spacer to physically set the upper top layer 1602 at the appropriate height from a substrate 1616. The light beam 1614 emitted by the laser diode 1612 couples into the first waveguide 1610 as is illustrated by the dashed lines in the top layer. Halfway through the upper layer 1602, the first waveguide 1610 splits into two branches 1604 and 1606. A first branch waveguide 1604 continues to guide the light beam 164 within the upper top layer 1602. A second branch waveguide 1606 continues to guide the light beam 1614 and transitions into the lower bottom layer 1610 and a second waveguide 1608. This transition can be created by varying the penetration depth.

These optical material layers can be used as overlays on active components such as microprocessors, Vertical Cavity Simulated Emission Lasers (VCSELs), laser diodes, and Micro-Electro-Mechanical Systems (MEMS) devices. Lift off techniques using soluble or meltable temporary attachment means are also embodied in this invention. A lifted off optical material layers or a supported optical material layers can be attached to non-flat substrates and incorporated into or on a printed circuit board. These optical material layers can be combined with optical components such as prisms, gratings, waveplates and optical amplifiers.

The electron beam apparatus and method can form an optical fiber for use as a waveguide having a core of a high refractive index surrounded by a cladding layer of a low refractive index formed of the same optical material.

Figure 22A:
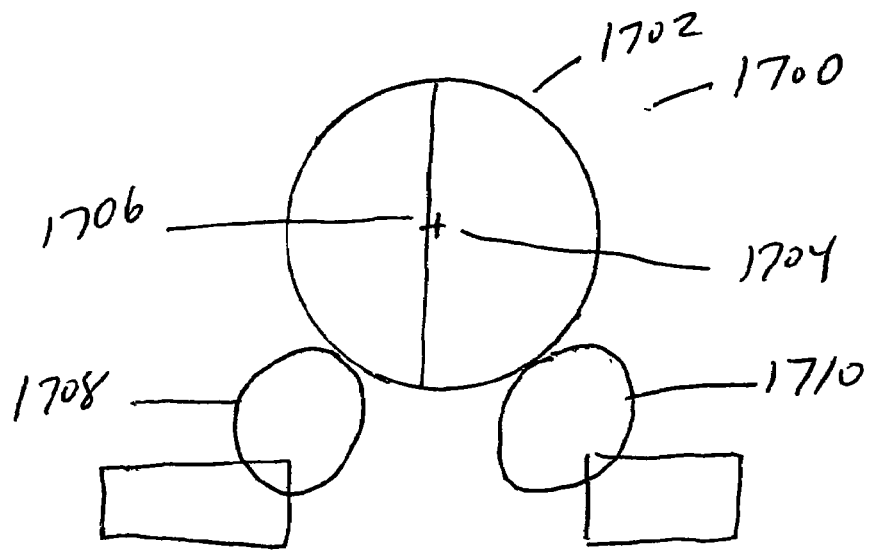
FIG. 22 shows in FIGS. 22A, 22B, 22C, and 22D schematic views of forming an optical fiber waveguide.

As shown in FIG. 22A, a cylindrical strand 1700 of starting optical material has an outer surface 1702 and a center 1704. The starting optical material strand 1700 will have an original index of refraction $n_0$ and a diameter 1706. The strand is supported and mounted between a first roller 1708 and a second roller 1710. The first and second rollers 1708 and 1710 rotate in the same direction, driven by a conventional motor (not shown in this Figure), as is known in the art. The strand 1700 rotates along its length as the rollers rotate.

Figure 22B:
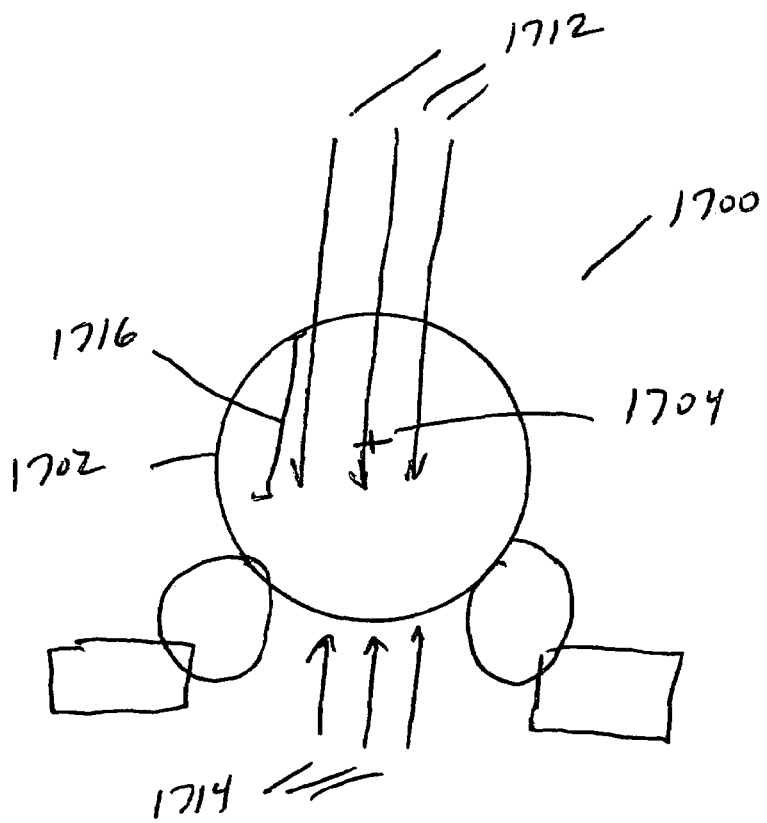

As shown in FIG. 22B, a large area electron beam 1712 is incident at a perpendicular angle to the outer surface 1702 of the optical material strand 1700 and irradiates the optical material strand. Infrared radiation beams 1714 will heat the starting optical material 1700 through the outer surface 1702 on the side of the strand away from the electron beam irradiation. The strand rotates during electron beam irradiation and heating.

The electron beam 1712 partially penetrates optical material strand 1700 to a depth or thickness 1716 through the outer surface 1702 past the center 1704 of the strand.

Figure 22C:
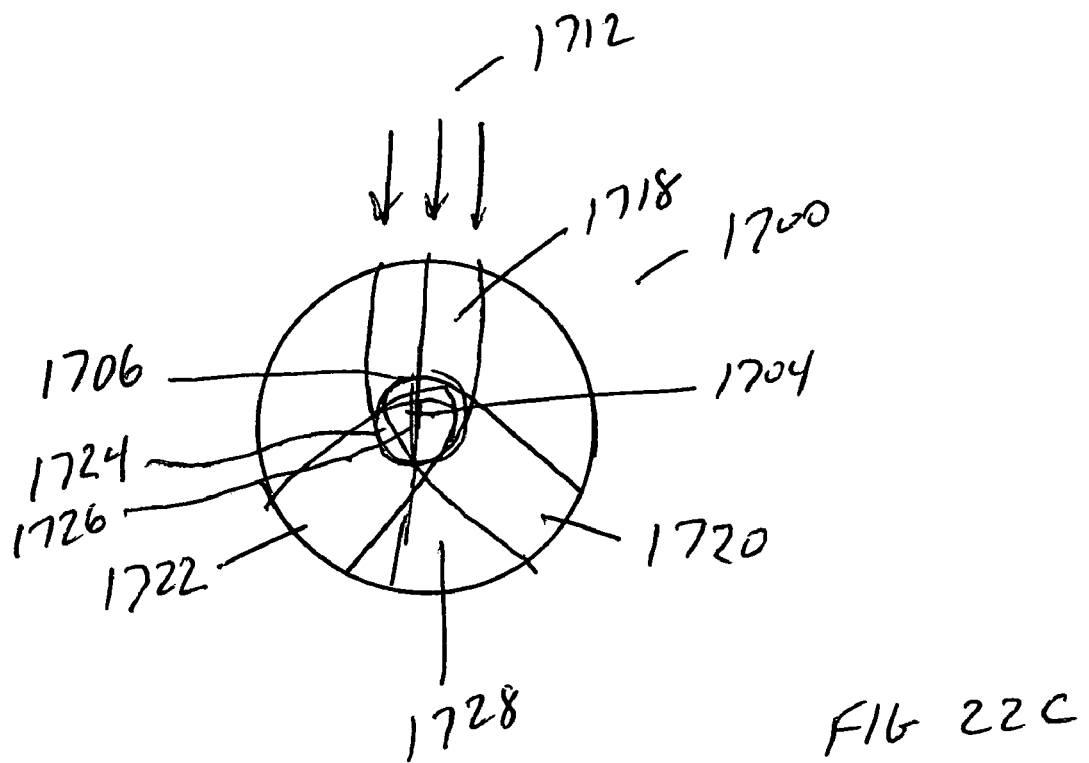

As shown in FIG. 22C, the electron beam 1712 irradiates the cylindrical strand 1700 of optical material unevenly across its diameter 1706. The first electron beam irradiation area 1718 at 0 degrees of rotation extends past the center 1704 of the strand 1700. The second electron beam irradiation area 1720 at 120 degrees of rotation extends past the center 1704 of the strand 1700. The third electron beam irradiation area 1722 at 240 degrees of rotation extends past the center 1704 of the strand 1700.

An inner cylindrical section 1724 of the cylindrical strand 1700 having a diameter 1726 around the center 1704 receives constant overlapping electron beam irradiation during rotation of the strand. An outer section 1728 near the outer surface 1702 of the cylindrical strand between the diameter 1726 of the inner cylindrical section and diameter 1706 of the cylindrical strand receives intermittent electron beam irradiation during an angular range of degrees of rotation. The electron beam will irradiate the cylindrical strand though a full 360 degrees of rotation. The areas at 0 degrees, 120 degrees and 240 degrees are merely illustrative examples.

Figure 22D:
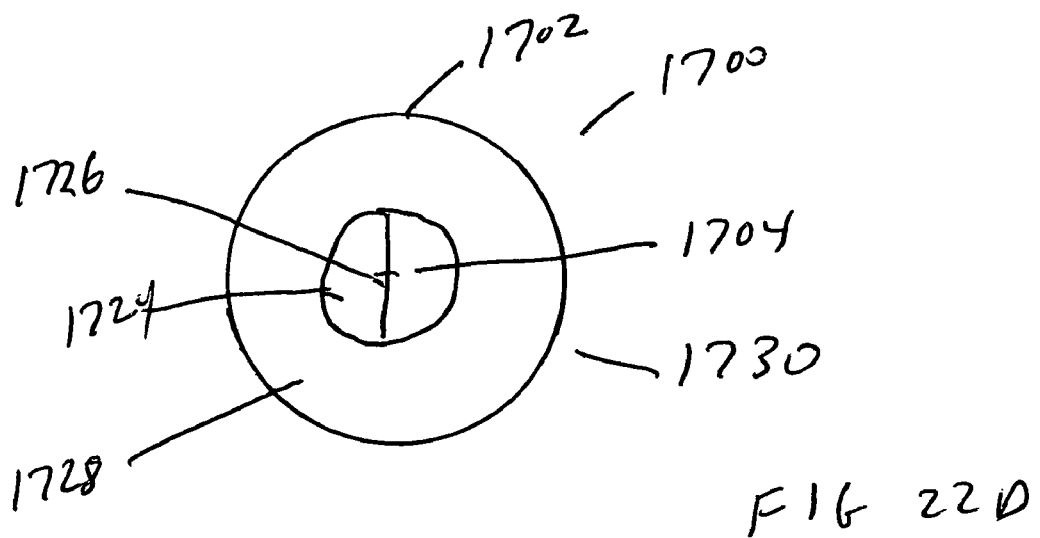

As shown in FIG. 22D, after heating and electron beam irradiation, the outer section 1728 near the outer surface 1702 of the cylindrical strand 1700 will have a radial gradient index of refraction $n_2$ to $n_1$ from diameter 1726 to the outer surface 1702 which is higher than the original index of refraction $n_0$ of the starting optical material.

The inner cylindrical section 1724 of the cylindrical strand 1700 will have a radial gradient index of refraction $n_4$ to $n_3$ from center 1704 to diameter 1726 which is higher than the original index of refraction $n_0$ of the starting optical material layer and which is higher than the gradient index of refraction $n_2$ to $n_1$ of the outer section.

Since the starting optical material strand is one strand, after electron beam irradiation, the inner section is integral and positioned adjacent to the outer section within the optical material.

The inner section 1724 of the cylindrical strand 1700 forms the high refractive index core layer of a waveguide 1730. The outer section 1728 of the cylindrical strand 1700 forms the low refractive index cladding layer of a waveguide 1730. The cladding layer surrounding the core layer forms a waveguiding optical fiber 1730 of the same optical material.

To provide uniform exposure of the cylindrical optical material 1700 along its cross-sectional diameter, the strand 1700 may rotate under the electron beam 1712 as seen in FIG. 22B or the electron beam 1712 may rotate around the strand 1700 (not shown in this Figure) or both the strand 1700 and electron beam 1712 may rotate in opposite directions or at differing speeds in the same direction (not shown in this Figure).

The temperature of the substrate supporting the starting optical material, the voltage of the electron beam, the dose of the electron beam, the duration and number of steps of the electron beam, the use of oxidizing or non-oxidizing gases in the low vacuum atmosphere, can each separately, or in combination, be varied to fabricate a uniform index of refraction for the cladding layer or the core layer of the optical fiber.

While there has been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

What is claimed is:

1. A waveguide comprising
a first layer of optical material having a first refractive index, said first layer having a first surface and a second surface, said second surface being opposite said first surface;
a first section of optical material on said first surface of said first layer extending into said first layer of optical material, said first section being integral with said first layer of optical material, said first section having a second refractive index, said second refractive index being higher than said first refractive index;
a second section of optical material on said second surface of said first layer extending into said first layer of optical material, said second section being integral with said first layer of optical material, said second section having a third refractive index, said third refractive index being higher than said first refractive index;
a core layer of optical material for said waveguide formed from said first section overlapping said second section within said first layer, said core layer having a fourth refractive index, said fourth refractive index being higher than said first refractive index, said second refractive index and said third refractive index;
wherein said first layer of optical material, said first section of optical material and said second section of optical material form a cladding layer for said waveguide, said cladding layer completely surrounding said core layer; and
wherein said optical material of said first layer is the same as said optical material of said first section, said second section and said core layer.

2. The waveguide of claim 1 wherein said second refractive index is the same as said third refractive index.

3. The waveguide of claim 1 wherein said first section of optical material, said second section of optical material and said core layer are formed by electron beam irradiation which raises the refractive index of said first section of optical material, said second section of optical material and said core layer of optical material.

4. The waveguide of claim 1 wherein said second refractive index, said third refractive index and said fourth refractive index are a gradient index of refraction.

5. The waveguide of claim 1 wherein said second refractive index, said third refractive index and said fourth refractive index are a uniform index of refraction.

* * * * *